(12) United States Patent
Shin et al.

(10) Patent No.: US 10,997,881 B2
(45) Date of Patent: May 4, 2021

(54) DISPLAY DEVICE INCLUDING A CRACK DETECTION LINE

(71) Applicant: Samsung Display Co., Ltd., Yongin-si (KR)

(72) Inventors: Jun Cheol Shin, Asan-si (KR); Won Jang Ki, Yongin-si (KR); Mi Jung Kim, Cheonan-si (KR); Sang Cheon Han, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 115 days.

(21) Appl. No.: 15/861,582

(22) Filed: Jan. 3, 2018

(65) Prior Publication Data

US 2019/0019441 A1    Jan. 17, 2019

(30) Foreign Application Priority Data

Jul. 12, 2017    (KR) .................... 10-2017-0088616

(51) Int. Cl.
*G09G 3/00*     (2006.01)
*H01L 51/00*    (2006.01)
(Continued)

(52) U.S. Cl.
CPC ........... *G09G 3/006* (2013.01); *G09G 3/3233* (2013.01); *H01L 27/3225* (2013.01);
(Continued)

(58) Field of Classification Search
CPC .. G09G 3/006; G09G 3/3233; G09G 2330/12; G09G 2310/0251;
(Continued)

(56) References Cited

U.S. PATENT DOCUMENTS

| 9,356,087 B1 | 5/2016 | Lee et al. |
| 2014/0319523 A1 | 10/2014 | Lee |

(Continued)

FOREIGN PATENT DOCUMENTS

| EP | 3098869 A1 | 11/2016 |
| KR | 10-2017-0024672 A | 3/2017 |

(Continued)

OTHER PUBLICATIONS

EPO Partial Search Report dated Jan. 2, 2019, for corresponding European Patent Application No. 18170953.6 (20 pages).

*Primary Examiner* — Patrick N Edouard
*Assistant Examiner* — Douglas M Wilson
(74) *Attorney, Agent, or Firm* — Lewis Roca Rothgerber Christie LLP

(57) ABSTRACT

A display device includes a base substrate which includes a display area and a peripheral area, the peripheral area including a bending area; a first test signal line and a second test signal line which are located on the peripheral area; a lower insulating layer which is located on the first test signal line and the second test signal line; a first test connection pattern which is located on the lower insulating layer and connected to the first test signal line; a second test connection pattern which is located on the lower insulating layer, spaced apart from the first test connection pattern, and connected to the second test signal line; an upper insulating layer; and a first crack detection line which is located on the upper insulating layer, is connected to the first and second test connection patterns, and has at least a portion overlapping the bending area.

29 Claims, 28 Drawing Sheets

(51) Int. Cl.
  *H01L 27/32* (2006.01)
  *G09F 9/30* (2006.01)
  *H04N 17/00* (2006.01)
  *G09G 3/3233* (2016.01)

(52) U.S. Cl.
  CPC ...... *H01L 27/3276* (2013.01); *H01L 51/0031* (2013.01); *H01L 51/0097* (2013.01); *H04N 17/004* (2013.01); *G09F 9/301* (2013.01); *G09G 2300/0426* (2013.01); *G09G 2300/0861* (2013.01); *G09G 2310/0251* (2013.01); *G09G 2310/0262* (2013.01); *G09G 2330/12* (2013.01); *H01L 27/3288* (2013.01); *H01L 2251/5338* (2013.01)

(58) Field of Classification Search
  CPC ... G09G 2300/0861; G09G 2300/0426; G09G 2310/0262; G09G 2320/043; H01L 51/0031; H01L 27/3225; H01L 27/3276; H01L 51/0097; H01L 27/3288; H01L 2251/5338; H04N 17/004; G09F 9/301; Y02E 10/549; G02F 1/1368; G02F 1/1309; Y10S 345/904
  See application file for complete search history.

(56) References Cited

U.S. PATENT DOCUMENTS

| | | | |
|---|---|---|---|
| 2014/0368228 A1* | 12/2014 | Kim | H01L 51/0097 324/750.3 |
| 2016/0043010 A1* | 2/2016 | Kwak | H01L 27/3276 257/48 |
| 2016/0140896 A1* | 5/2016 | Kwon | G09G 3/006 345/76 |
| 2016/0232826 A1 | 8/2016 | Cho | |
| 2016/0322451 A1 | 11/2016 | Park | |
| 2018/0053466 A1* | 2/2018 | Zhang | G09G 3/20 |
| 2018/0173277 A1* | 6/2018 | Lee | G06F 1/1652 |
| 2018/0174505 A1* | 6/2018 | Mandlik | G09G 3/3677 |
| 2018/0358413 A1* | 12/2018 | Lee | G06F 3/0443 |
| 2019/0157312 A1* | 5/2019 | Lee | H01L 51/52 |

FOREIGN PATENT DOCUMENTS

| | | |
|---|---|---|
| KR | 10-2017-0025620 A | 3/2017 |
| KR | 10-2017-0026046 A | 3/2017 |
| KR | 10-2018-0056497 | 5/2018 |
| KR | 10-2018-0066306 | 6/2018 |
| KR | 10-2018-0096875 | 8/2018 |

* cited by examiner

DISPLAY DEVICE INCLUDING A CRACK DETECTION LINE

CROSS-REFERENCE TO RELATED APPLICATION

This application claims priority to and the benefit of Korean Patent Application No. 10-2017-0088616, filed on Jul. 12, 2017 in the Korean Intellectual Property Office, the entire disclosure of which is incorporated herein by reference.

BACKGROUND

1. Field

Aspects of embodiments of the present inventive concept relate to a display device.

2. Description of the Related Art

With the development of information technology, the market for display devices as connection media between users and information is growing. Accordingly, the use of display devices such as liquid crystal displays and organic light emitting displays is increasing.

If a display device has flexibility, it can be bent, folded, or rolled to be carried around. Thus, the flexibility of the display device can contribute greatly to ensuring portability while expanding the screen of the display device.

In this regard, research is being conducted on flexible display devices, and various attempts are being made to reduce the area of a non-display area of a display device.

When at least a portion of a display device is bent, a conductive pattern such as a wiring located in the bent portion can crack, thereby reducing the reliability of the display device.

SUMMARY

According to an aspect of embodiments, a display device has a structure in which at least a portion of a peripheral area may be bent.

According to another aspect of embodiments, a display device is capable of detecting a crack generated in a bent portion.

According to one or more embodiments, a display device includes a base substrate which comprises a display area and a peripheral area other than the display area, wherein the peripheral area comprises a bending area; a first test signal line and a second test signal line which are located on the peripheral area of the base substrate and at least partially spaced apart from each other; a lower insulating layer which is located on the first test signal line and the second test signal line; a first test connection pattern which is located on the lower insulating layer and connected to the first test signal line; a second test connection pattern which is located on the lower insulating layer, spaced apart from the first test connection pattern, and connected to the second test signal line; an upper insulating layer which is located on the first test connection pattern and the second test connection pattern; and a first crack detection line which is located on the upper insulating layer, is connected to the first test connection pattern and the second test connection pattern, and has at least a portion overlapping the bending area of the base substrate.

According to one or more embodiments, a display device includes a base substrate which comprises a display area and a peripheral area other than the display area, wherein the peripheral area comprises a bending area; a first test signal line and a second test signal line which are located on the peripheral area of the base substrate and at least partially spaced apart from each other; a crack detection line which has at least a portion located on the bending area of the base substrate and is electrically connected to the first test signal line and the second test signal line; and a data line and a driving voltage line which are located on the display area of the base substrate, wherein the data line and the driving voltage line are located on different layers, the data line and the crack detection line are located on different layers, and the crack detection line is located on a different layer from the first test signal line and the second test signal line.

According to one or more embodiments, a display device includes a base substrate which comprises a display area and a peripheral area other than the display area, wherein the peripheral area comprises a bending area; a first test signal line and a second test signal line which are located on the peripheral area of the base substrate and at least partially separated from each other; a crack detection line which has at least a portion located on the bending area of the base substrate and is electrically connected to the first test signal line and the second test signal line; a data line which is located on the display area of the base substrate; a connection pad which is located on the peripheral area of the base substrate; and a bridge wiring which electrically connects the data line and the connection pad, wherein the data line and the bridge wiring are located on different layers, the crack detection line and the bridge wiring are located on different layers, and the crack detection line is located on a different layer from the first test signal line and the second test signal line.

BRIEF DESCRIPTION OF THE DRAWINGS

These and/or other aspects will become apparent and more readily appreciated from the following description of some example embodiments, taken in conjunction with the accompanying drawings in which.

DETAILED DESCRIPTION

Figure 1:
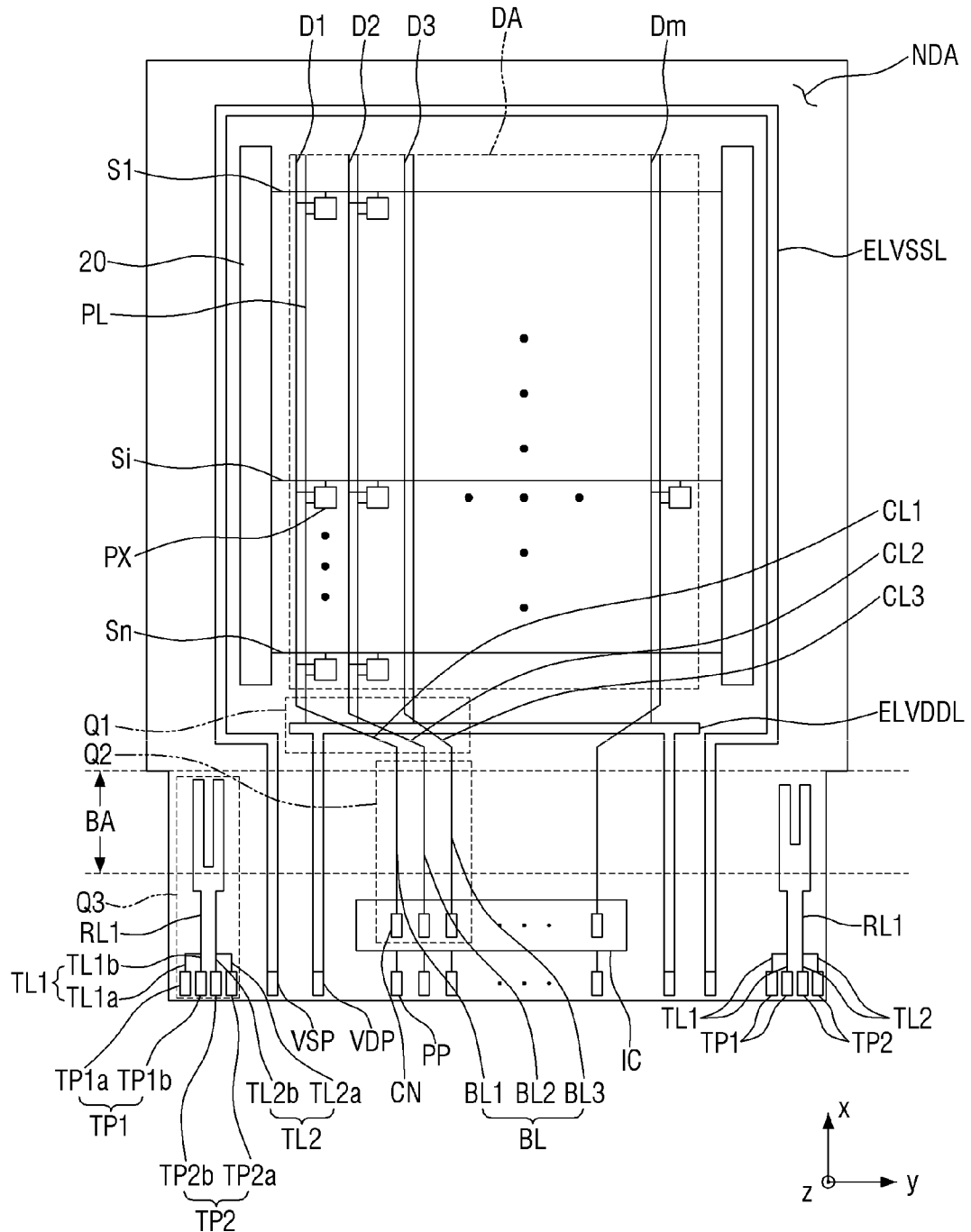
FIG. 1 is a plan view of a display device according to an embodiment.

Some example embodiments are described with reference to the accompanying drawings. The example embodiments may be embodied in many different forms and should not be construed as being limited. Like reference numerals may refer to like elements in the description.

Although the terms "first," "second," etc. may be used herein to describe various elements, these elements should not be limited by these terms. These terms may be used to distinguish one element from another element. Thus, a "first" element discussed below may be termed a "second" element without departing from the teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

The terminology used herein is for describing particular embodiments and is not intended to be limiting. The singular forms "a," "an," and "the" may include the plural forms as well, unless the context clearly indicates otherwise. The term(s) "comprises" and/or "comprising" may specify the presence of stated steps and/or elements, but may not preclude the presence or addition of one or more other steps and/or elements.

When a first element is referred to as being "on," "connected to," or "coupled to" a second element or layer, the first element can be directly on, connected, or coupled to the second element, or one or more intervening elements may be present between the first element and the second element. In contrast, when a first element is referred to as being "directly on," "directly connected to," or "directly coupled to" a second element or layer, there are no intended intervening elements (except environmental elements such as air) present between the first element and the second element. The term "and/or" may include any and all combinations of one or more of the associated items.

Spatially relative terms, such as "beneath," "below," "lower," "above," and "upper," may be used to describe one element or feature's relationship to another element(s) or feature(s). The spatially relative terms may encompass different orientations of the device in use or operation in addition to the described orientation(s). For example, if the device is turned over, elements described as "below" or "beneath" other elements or features would then be positioned "above" the other elements or features. Thus, the term "below" can encompass both a position of above and below. The device may be otherwise oriented (e.g., rotated 90 degrees or at other orientations), and the spatially relative descriptors may be interpreted accordingly.

Unless otherwise defined, all terms (including technical and scientific terms) used herein have the same meaning as commonly understood by one of ordinary skill in the art to which the present application belongs. Terms, such as those defined in commonly used dictionaries, should be interpreted as having a meaning that is consistent with their meaning in the context of the relevant art and this specification and should not be interpreted in an idealized or overly formal sense unless expressly so defined herein.

In the drawings, components may be exaggerated or reduced in size for convenience of explanation.

The term "pattern" may mean "member," "unit," or "element." The term "sectional" may mean "cross-sectional." The term "connect" may mean "electrically connect." The term "insulate" may mean "electrically insulate" or "electrically isolate." The term "contain" may mean "be formed of" and/or "include." The term "overlap" or "cover" may be in or according to a direction perpendicular to a bottom face of a base substrate; i.e. when a first element of a device overlaps or covers a second element of the device, the second element is partially or completely blocked by the first element when the device (or a combination of the first element and the second element) is viewed in a direction perpendicular to a base substrate of the device.

Throughout the specification, the same reference numerals in the drawings denote the same or similar elements.

Herein, embodiments of the inventive concept will be described with reference to the drawings.

Figure 2:
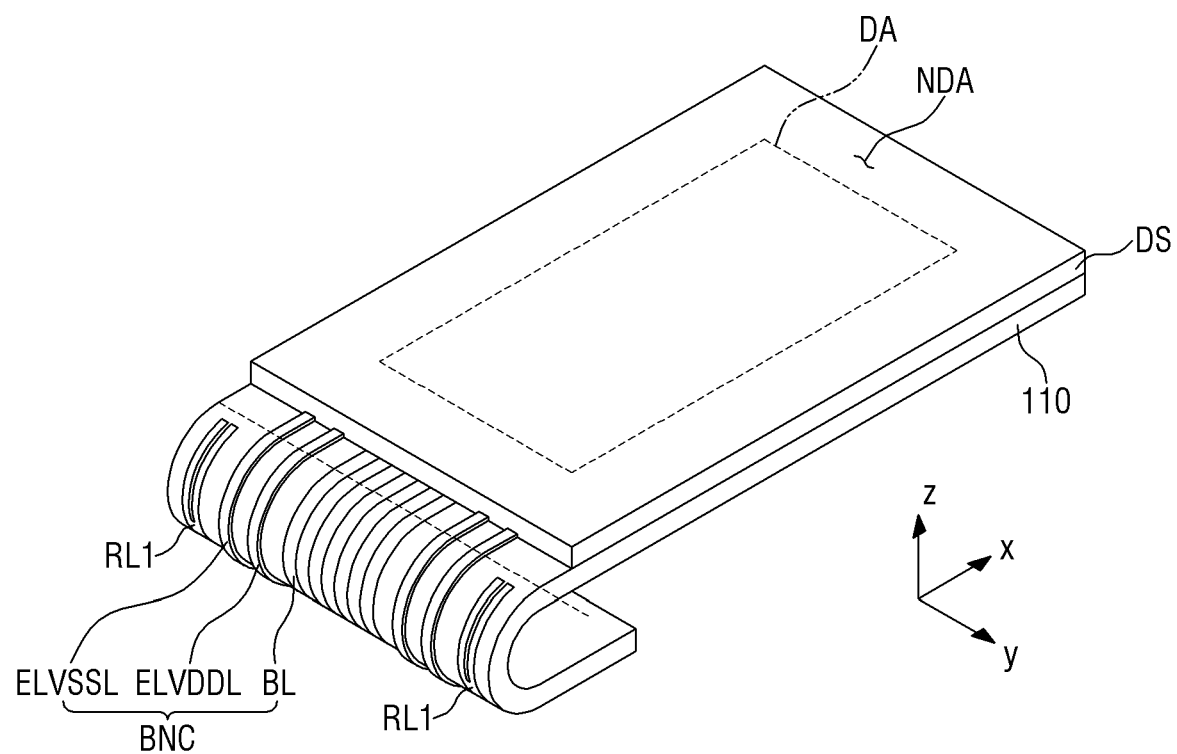
FIG. 2 is a perspective view of the display device of FIG. 1, shown bent along a bending area.
Figure 3:
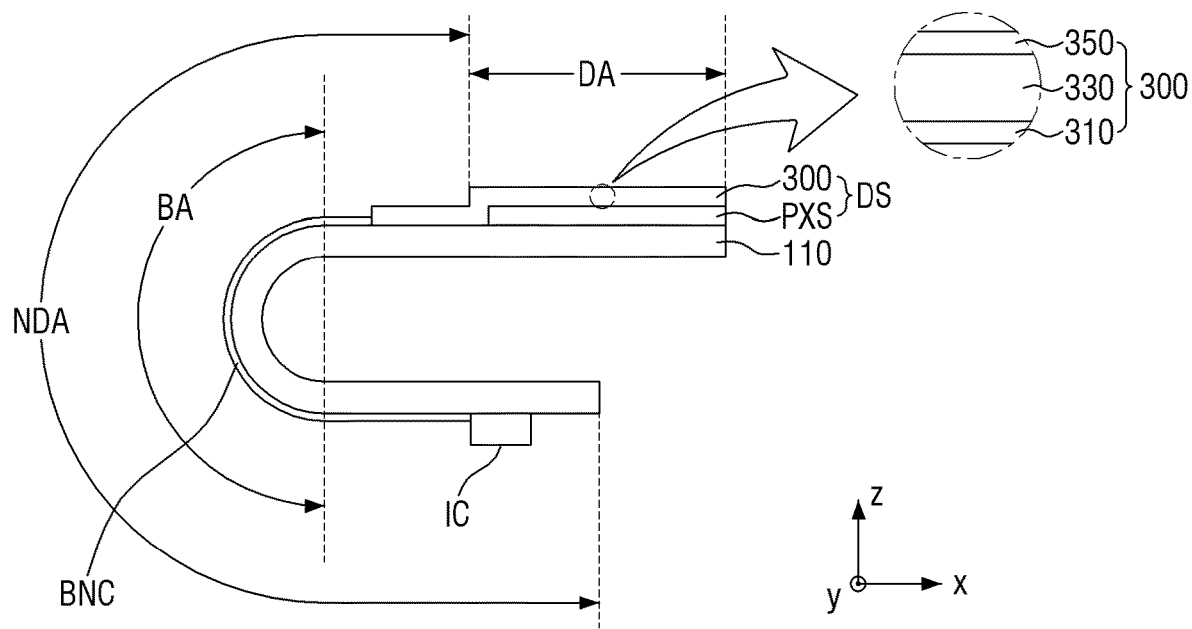
FIG. 3 is a schematic cross-sectional view of the display device illustrated in FIG. 2.

FIG. 1 is a plan view of a display device according to an embodiment. FIG. 2 is a perspective view of the display device of FIG. 1, shown bent along a bending area BA. FIG. 3 is a schematic cross-sectional view of the display device illustrated in FIG. 2.

Referring to FIGS. 1 through 3, the display device may include a base substrate 110, a display structure DS provided on the base substrate 110, a scan driver 20, conductors for detecting bends or cracks, a common voltage supply wiring ELVSSL, a driving voltage supply wiring ELVDDL, and pads. The display structure DS may include a pixel structure PXS and an encapsulation layer 300. In some embodiments, the display device may further include a driver IC.

The base substrate 110 may be an insulating substrate and may include a plurality of areas. For example, the base substrate 110 may include a display area DA and a peripheral area NDA around the display area DA, and the peripheral area NDA may include the bending area BA.

The base substrate 110 may include any of various materials (e.g., a polymer material) having flexible or bendable characteristics. For example, the polymer material may be polyethersulphone (PES), polyacrylate (PA), polyarylate (PAR), polyetherimide (PEI), polyethylenenaphthalate (PEN), polyethyleneterephthalate (PET), polyphenylenesulfide (PPS), polyallylate, polyimide (PI), polycarbonate (PC), cellulosetriacetate (CAT), cellulose acetate propionate (CAP), or a combination of these materials.

The display area DA of the base substrate 110 is an area for displaying an image. The pixel structure PXS may be disposed on the display area DA of the base substrate 110, and the encapsulation layer 300 may be located on the pixel structure PXS. The pixel structure PXS may be defined as a structure positioned between the base substrate 110 and the encapsulation layer 300 among structures located on the display area DA of the base substrate 110.

The pixel structure PXS may include a plurality of scan lines S1, Si, and Sn extending in a first direction y, a plurality of data lines D1, D2, D3, and Dm intersecting the scan lines S1, Si, and Sn and extending in a second direction x, a plurality of driving voltage wirings PL, and a plurality of pixels PX.

In some embodiments, each of the pixels PX may include a self-luminous element. In an exemplary embodiment, the self-luminous element may include at least one of an organic light emitting diode, a quantum dot light emitting diode, and an inorganic ultra-small light emitting diode (e.g., a micro LED). In the embodiments, for ease of description, a case in which the self-luminous element is an organic light emitting diode will be described as an example.

In some embodiments, each of the pixels PX may emit one of red, green, and blue. However, the inventive concept is not limited to this case. For example, each of the pixels PX may emit a color such as cyan, magenta, yellow, or white.

The pixels PX will be described in more detail later.

The encapsulation layer 300 may prevent or substantially prevent moisture and air, which can be introduced from the outside, from penetrating the pixel structure PXS. The encapsulation layer 300 may include a first inorganic layer 310, an organic layer 330, and a second inorganic layer 350 in an embodiment.

The first inorganic layer 310 may be disposed on the pixel structure PXS. In an embodiment, the first inorganic layer 310 may include any one of silicon oxide (SiOx), silicon nitride (SiNx), and silicon oxynitride (SiONx).

The organic layer 330 may be disposed on the first inorganic layer 310. In an embodiment, the organic layer 330 may include any one of epoxy, acrylate, and urethane acrylate.

The second inorganic layer 350 may be disposed on the organic layer 330. In an embodiment, the second inorganic layer 350 may include any one or more of silicon oxide (SiOx), silicon nitride (SiNx), and silicon oxynitride (SiONx).

In FIG. 3, each of the first inorganic layer 310, the organic layer 330, and the second inorganic layer 350 is shown as a single layer. However, the inventive concept is not limited to this case. That is, at least one of the first inorganic layer 310, the organic layer 330, and the second inorganic layer 350 may have a multilayer structure.

In addition, when at least one of the first inorganic layer 310 and the second inorganic layer 350 has a multilayer structure, at least one of the first inorganic layer 310 and the second inorganic layer 350 having the multilayer structure may be a hexamethyldisiloxane (HMDSO) layer. The HMDSO layer can absorb stress. Accordingly, the encapsulation layer 300 can be made more flexible. Alternatively, in an embodiment, the organic layer 330 may be changed to the HMDSO layer.

The peripheral area NDA of the base substrate 110 may be located around the display area DA. In some embodiments, the peripheral area NDA may surround the display area DA. The pixel structure PXS may not be disposed on the peripheral area NDA of the base substrate 110. That is, the peripheral area NDA of the base substrate 110 may be a non-display area where no image is displayed.

The scan driver 20, the common voltage supply wiring ELVSSL, the driving voltage supply wiring ELVDDL, a driving voltage supply pad VPP, a common voltage supply pad VSP, connection wiring parts CL1, CL2, and CL3, bridge wirings BL1, BL2, and BL3, connection pads CN, a first crack detection line RL1, first and second test signal lines TL1 and TL2, and first and second test pads TP1 and TP2 may be disposed on the peripheral area NDA of the base substrate 110. In some embodiments, the driver IC and input pads PP may be further disposed on the peripheral area NDA of the base substrate 110.

The scan driver 20 is connected to the scan lines S1, Si, and Sn and generates and transmits scan signals to the pixels PX through the scan lines S1, Si, and Sn. In some embodiments, the scan driver 20 may be disposed on left and right sides of the display area DA. In an embodiment, one scan driver 20 may be disposed on the left or right side of the display area DA.

The driving voltage supply wiring ELVDDL is connected to the driving voltage wirings PL and supplies driving voltages to the pixels PX through the driving voltage wirings PL. The driving voltage supply wiring ELVDDL may be disposed on the base substrate 110 to surround at least part of the peripheral area NDA. In an embodiment, the driving voltage supply wiring ELVDDL may be disposed on one side of the display area DA to partially surround the display area DA, as illustrated in FIG. 1.

At least a portion of the driving voltage supply wiring ELVDDL may extend on the peripheral area NDA along the first direction y, and the other portion of the driving voltage supply wiring ELVDDL may extend along the second direction x to be connected to a driving voltage supply pad VDP located on the peripheral area NDA of the base substrate 110.

The common voltage supply wiring ELVSSL may provide a common voltage to the pixels PX. In an embodiment, the common voltage supply wiring ELVSSL may be electrically connected to a cathode CD (see FIG. 6), which will be described later, in the peripheral area NDA so as to provide the common voltage to the cathode CD.

The common voltage supply wiring ELVSSL may be disposed on the base substrate 110 to surround at least part of the peripheral area NDA. In an embodiment, the common voltage supply wiring ELVSSL may completely surround the display area DA, as illustrated in FIG. 1.

At least a portion of the common voltage supply wiring ELVSSL may extend on the peripheral area NDA along the second direction x to be connected to the common voltage supply pad VSP located on the peripheral area NDA of the base substrate 110.

The connection wiring parts CL1, CL2, and CL3 including the bridge wirings BL may be located on the peripheral area NDA of the base substrate 110.

The first connection wiring part CL1 among the connection wiring parts CL1, CL2, and CL3 electrically connects the first data line D1 to any one of the connection pads CN. The first connection wiring part CL1 may include a first bridge wiring BL1 located on the bending area BA of the base substrate 110 among the bridge wirings BL. Similarly, the second connection wiring part CL2 may electrically connect the second data line D2 to another one of the connection pads CN and may include a second bridge wiring BL2 located on the bending area BA among the bridge wirings BL. The third connection wiring part CL3 may electrically connect the third data line D3 to another one of the connection pads CN and may include a third bridge wiring BL3 located on the bending area BA among the bridge wirings BL.

The structure of the connection wiring parts CL1, CL2, and CL3 will be described in further detail later.

In some embodiments, the driver IC may be disposed on the peripheral area NDA of the base substrate 110. In this case, the driver IC may be connected to the connection pads CN. The driver IC may generate and transmit driving signals (e.g., data signals) for driving the pixels PX. When the driver IC is disposed on the peripheral area NDA of the base substrate 110, the input pads PP electrically connected to the driver IC may be provided on the peripheral area NDA of the base substrate 110.

In some embodiments, the driver IC may be a driver chip.

When the driver IC is disposed on the peripheral area NDA of the base substrate 110, the input pads PP may be electrically connected to a printed circuit board (PCB) (not illustrated).

However, the inventive concept is not limited to this case. In an embodiment, if the driver IC is not disposed on the peripheral area NDA of the base substrate 110, the input pads PP may not be provided. In this case, the connection pads CN may be electrically connected to the PCB, and the driver IC may be disposed on the PCB.

The first crack detection line RL1 may be located on the peripheral area NDA of the base substrate 110. The first crack detection line RL1 may be located on the bending area BA of the peripheral area NDA of the base substrate 110 and may include a plurality of bent portions.

When a crack occurs in the first crack detection line RL1, it is possible to estimate the probability that a crack will occur in wirings provided on the bending area BA, such as the bridge wirings BL1, BL2, and BL3.

In some embodiments, the first crack detection line RL1 may be disposed on both sides of the bridge wirings BL along the first direction y, as illustrated in FIG. 1. However, in an embodiment, the first crack detection line RL1 may be disposed only on one side of the bridge wirings BL along the first direction y.

The first test signal line TL1 connected to a side of the first crack detection line RL1, the first test pad TP1 connected to the first test signal line TL1, the second test signal line TL2 connected to the other side of the first crack detection line RL1, and the second test pad TP2 connected to the second test signal line TL2 may be located on the peripheral area NDA of the base substrate 110.

A test signal for crack detection may be transmitted to the first test pad TP1 and the second test pad TP2. The test signal may be provided to the first crack detection line RL1 via the first test signal line TL1 and the second test signal line TL2. In addition, an output signal generated in response to the test signal may be output to the first test pad TP1 and the second test pad TP2 via the first test signal line TL1 and the second test signal line TL2.

In some embodiments, the first test signal line TL1 may include a first sub-test signal line TL1a and a second sub-test signal line TL1b connected to a side of the first crack detection line RL1. The first test pad TP1 may include a first sub-test pad TP1a connected to the first sub-test signal line TL1a and a second sub-test pad TP1b connected to the second sub-test signal line TL1b. Similarly, the second test signal line TL2 may include a third sub-test signal line TL2a and a fourth sub-test signal line TL2b connected to the other side of the first crack detection line RL1. The second test pad TP2 may include a third sub-test pad TP2a connected to the third sub-test signal line TL2a and a fourth sub-test pad TP2b connected to the fourth sub-test signal line TL2b.

In some embodiments, the first test signal line TL1, the second test signal line TL2, the first test pad TP1, and the second test pad TP2 may be located on an area other than the bending area BA of the peripheral area NDA of the base substrate 110.

The peripheral area NDA includes the bending area BA. The bending area BA may be disposed between the connection pads CN and the display area DA. The bending area BA may extend along a direction intersecting the bridge wirings BL located on the peripheral area NDA. For example, the bending area BA may extend along the second direction x while having a width (e.g., a predetermined width) along the first direction y.

The display device according to the current embodiment may be bent at the bending area BA in a direction opposite to a third direction z. For example, a portion of the base substrate 110 of the display device may be bent in the direction opposite to the third direction z, as illustrated in FIG. 2. For example, the base substrate 110 may be bent about a bending axis extending in the first direction y. Thus, the display device may also have a bent shape like the base substrate 110. That is, the area of the peripheral area NDA visible to a user can be reduced by bending a portion of the peripheral area NDA in the direction opposite to the third direction z.

As mentioned above, the bridge wirings BL and the first crack detection line RL1 are located on the bending area BA of the peripheral area NDA of the base substrate 110. In addition, a portion of the driving voltage supply wiring ELVDDL and a portion of the common voltage supply wiring ELVSSL may be located on the bending area BA of the base substrate 110.

If the bridge wirings BL, a portion of the driving voltage supply wiring ELVDDL, and a portion of the common voltage supply wiring ELVSSL located on the bending area BA of the base substrate 110 are collectively referred to as a bending line BNC, the bending line BNC can crack in the bending area BA due to tensile stress or compressive stress, thereby degrading the reliability of the display device. In the display device according to the current embodiment, however, the first crack detection line RL1 is located on the bending area BA of the base substrate 110. In addition, it is possible to detect whether a crack has occurred in the first crack detection line RL1 in the process of manufacturing the display device and to judge from the crack in the first crack detection line RL1 that the bending line BNC has cracked. That is, since a crack can be detected in the manufacturing process, the reliability of the display device can be improved.

Also, it is possible to detect whether the first crack detection line RL1 has cracked even during use of the display device and to stop the operation of the display device if the first crack detection line RL1 has cracked. This can prevent inconvenience to a user due to a malfunction.

Figure 4:
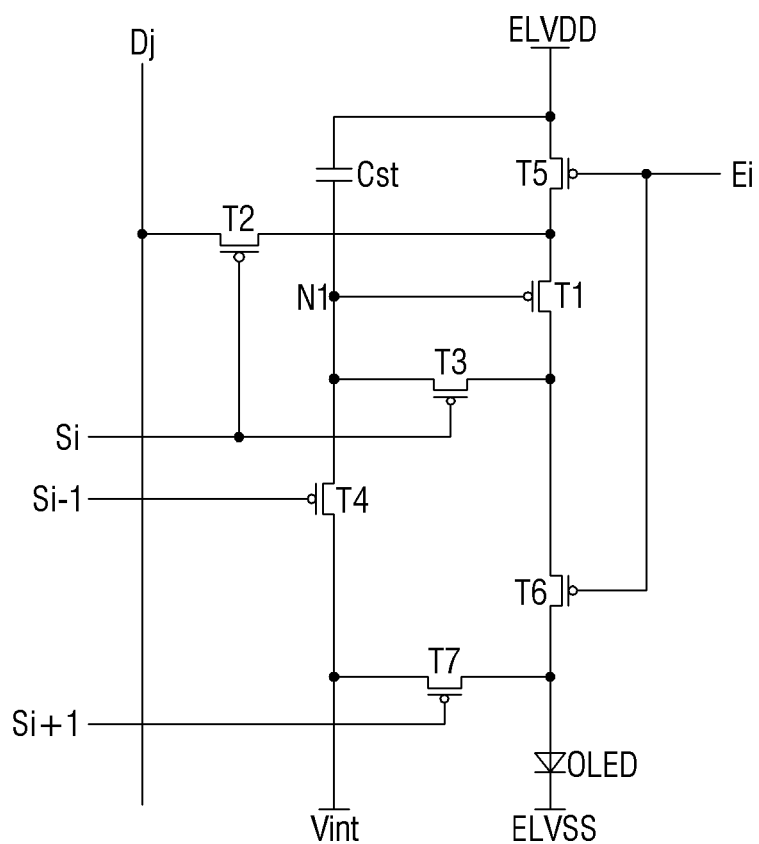
FIG. 4 is an equivalent circuit diagram of an embodiment of a pixel illustrated in FIG. 1.

FIG. 4 is an equivalent circuit diagram of an embodiment of a pixel PX illustrated in FIG. 1. In FIG. 4, a pixel PX connected to a $j^{th}$ data line Dj, an $(i-1)^{th}$ scan line Si−1, an $i^{th}$ scan line Si, and an $(i+1)^{th}$ scan line Si+1 is illustrated for ease of description.

Referring to FIG. 4, the pixel PX according to the current embodiment includes an organic light emitting diode OLED, a first transistor T1, a second transistor T2, a third transistor T3, a fourth transistor T4, a fifth transistor T5, a sixth transistor T6, a seventh transistor T7, and a storage capacitor Cst.

An anode of the organic light emitting diode OLED may be connected to the first transistor T1 via the sixth transistor T6, and a cathode of the organic light emitting diode OLED may be connected to a common power source to which a common voltage ELVSS is provided. The organic light emitting diode OLED may generate light of a luminance level corresponding to the amount of current supplied from the first transistor T1.

A driving voltage ELVDD may be set to a voltage higher than the common voltage ELVSS such that a current can flow through the organic light emitting diode OLED.

The seventh transistor T7 is connected between an initialization power source provided with an initialization voltage Vint and the anode of the organic light emitting diode OLED. A gate electrode of the seventh transistor T7 is connected to the $(i+1)^{th}$ scan line Si+1. The seventh transistor T7 is turned on when a scan signal is transmitted to the $(i+1)^{th}$ scan line Si+1 to supply the initialization voltage Vint to the anode of the organic light emitting diode OLED. Here, the initialization voltage Vint may be set to a voltage lower than a data voltage provided to the $j^{th}$ data line Dj.

The sixth transistor T6 is connected between the first transistor T1 and the organic light emitting diode OLED. A gate electrode of the sixth transistor T6 is connected to an $i^{th}$ emission control wiring Ei. The sixth transistor T6 is turned off when an emission control signal is supplied to the $i^{th}$ emission control wiring Ei and is turned on in other cases.

The fifth transistor T5 is connected between a driving power source provided with the driving voltage ELVDD and the first transistor T1. A gate electrode of the fifth transistor T5 is connected to the $i^{th}$ emission control wiring Ei. The fifth transistor T5 is turned off when the emission control signal is supplied to the $i^{th}$ emission control wiring Ei and is turned on in other cases.

A first electrode of the first transistor T1 (a driving transistor) is connected to the driving power source, to which the driving voltage ELVDD is provided, via the fifth transistor T5, and a second electrode of the first transistor T1 is connected to the anode of the organic light emitting diode OLED via the sixth transistor T6. In addition, a gate electrode of the first transistor T1 is connected to a first node N1. The first transistor T1 controls the amount of current, which flows from the driving power source provided with the driving voltage ELVDD to the common power source ELVSS via the organic light emitting diode OLED, according to the voltage of the first node N1.

The third transistor T3 is connected between the second electrode of the first transistor T1 and the first node N1. A gate electrode of the third transistor T3 is connected to the $i^{th}$ scan line Si. The third transistor T3 is turned on when a scan signal is supplied to the $i^{th}$ scan line Si to electrically connect the second electrode of the first transistor T1 and the first node N1. Therefore, when the third transistor T3 is turned on, the first transistor T1 is connected in a diode form.

The fourth transistor T4 is connected between the first node N1 and the initialization power source Vint. A gate electrode of the fourth transistor T4 is connected to the $(i-1)^{th}$ scan line Si−1. The fourth transistor T4 is turned on when a scan signal is transmitted to the $(i-1)^{th}$ scan line Si−1 to supply the voltage of the initialization power source Vint to the first node N1.

The second transistor T2 is connected between the $j^{th}$ data line Dj and the first electrode of the first transistor T1. A gate electrode of the second transistor T2 is connected to the $i^{th}$ scan line Si. The second transistor T2 is turned on when a scan signal is supplied to the $i^{th}$ scan line Si to electrically connect the $j^{th}$ data line Dj and the first electrode of the first transistor T1.

The storage capacitor Cst is connected between the driving power source provided with the driving voltage ELVDD and the first node N1. The storage capacitor Cst stores a voltage corresponding to the data voltage and a threshold voltage of the first transistor T1.

Figure 5:
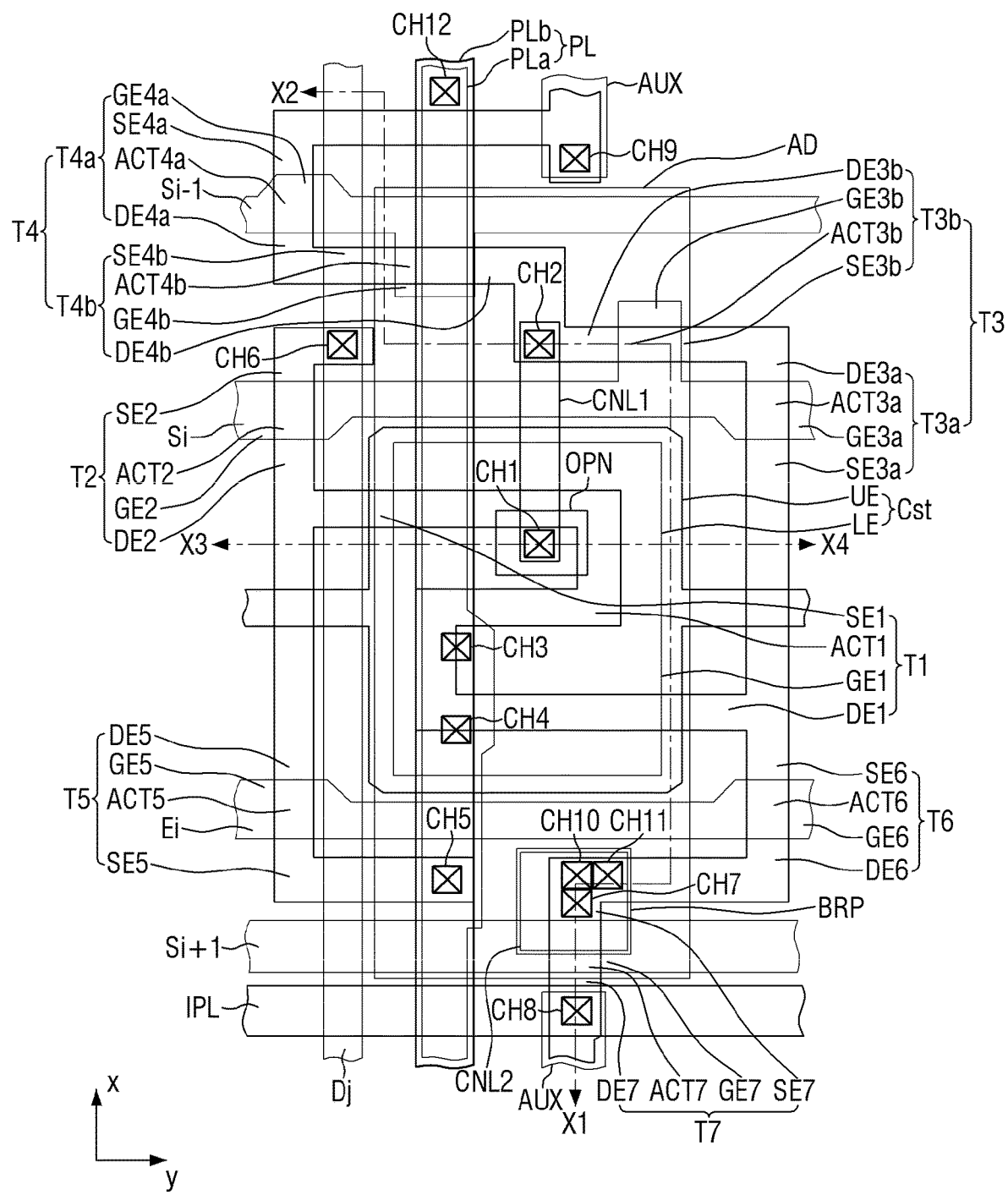
FIG. 5 is a plan view illustrating the exemplary structure of the pixel of FIG. 4 in further detail.
Figure 6:
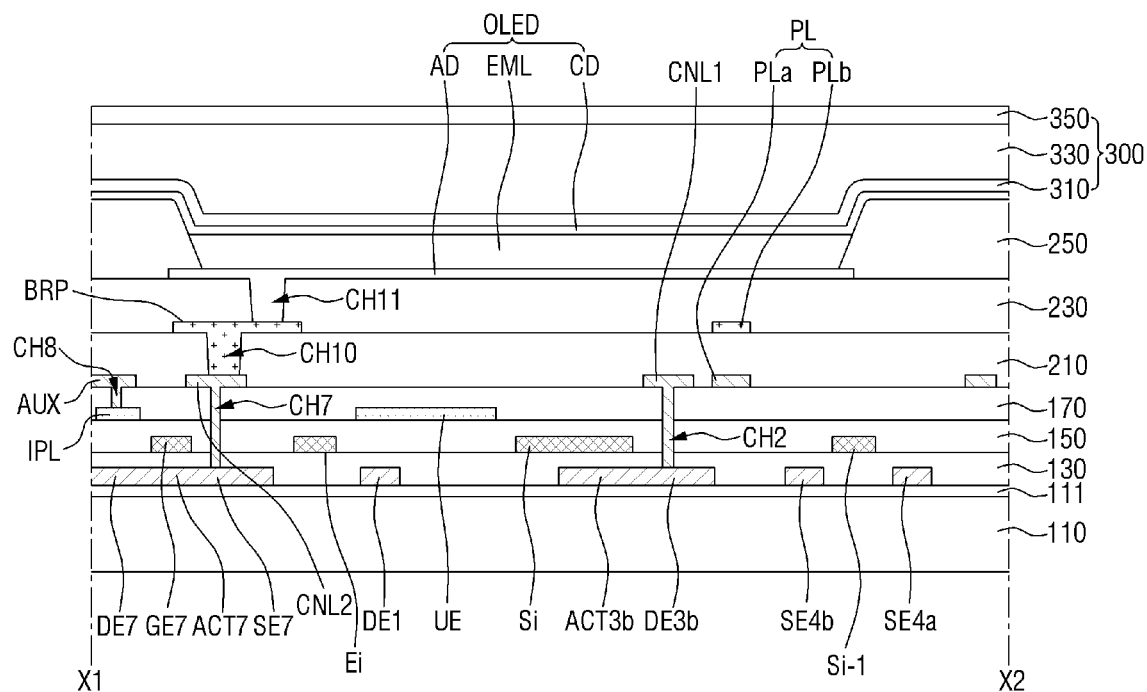
FIG. 6 is a cross-sectional view taken along the line X1-X2 of FIG. 5.
Figure 7:
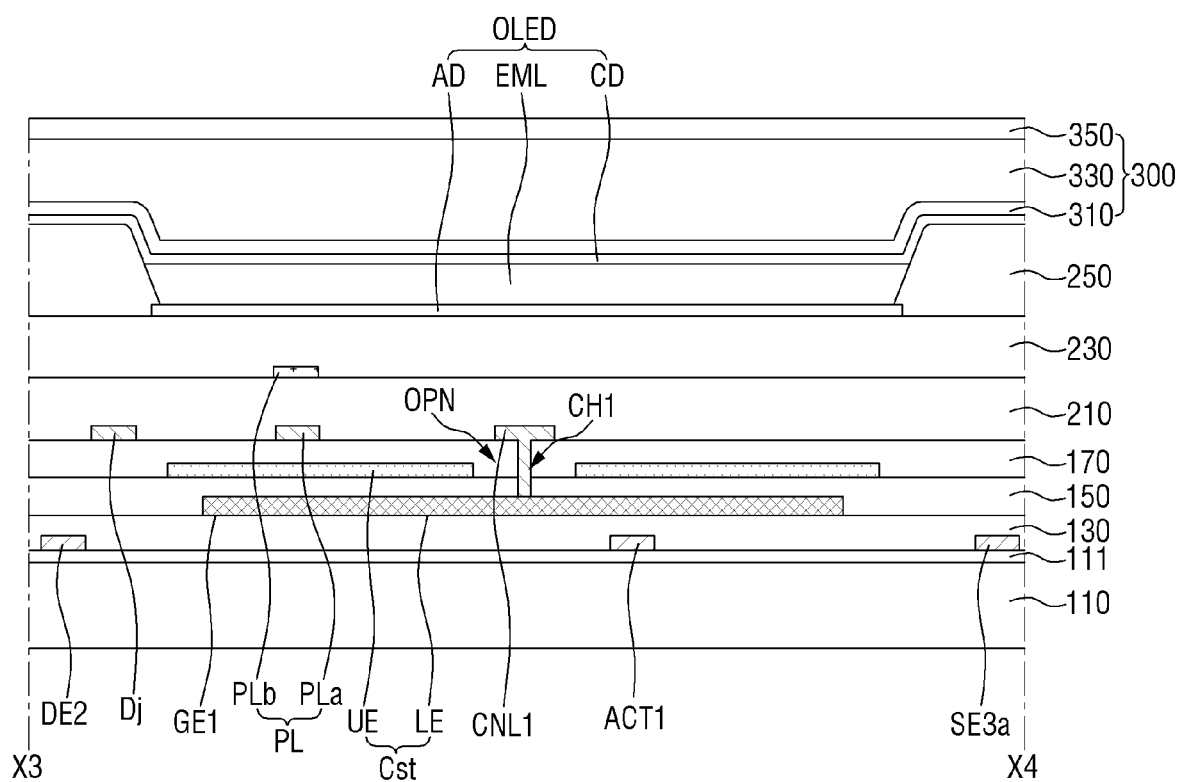
FIG. 7 is a cross-sectional view taken along the line X3-X4 of FIG. 5.

FIG. 5 is a plan view illustrating the exemplary structure of the pixel PX of FIG. 4 in further detail. FIG. 6 is a cross-sectional view taken along the line X1-X2 of FIG. 5. FIG. 7 is a cross-sectional view taken along the line X3-X4 of FIG. 5.

In FIGS. 5 through 7, three scan lines Si−1, Si and Si+1, an emission control wiring Ei, a driving voltage wiring PL, and a data line Dj connected to one pixel PX disposed in an $i^{th}$ row and a $j^{th}$ column are illustrated. In FIGS. 5 through 7, for ease of description, a scan line in an $(i-1)^{th}$ row will be referred to as an "$(i-1)^{th}$ scan line Si−1," a scan line in an $i^{th}$ row will be referred to as an "$i^{th}$ scan line Si," a scan line in an $(i+1)^{th}$ row will be referred to as an "$(i+1)^{th}$ scan line Si+1," an emission control wiring in the $i^{th}$ row will be referred to as an "emission control wiring Ei," a data line in the $j^{th}$ column will be referred to as a "data line Dj," and a driving voltage wiring in the $j^{th}$ column will be referred to as a "driving voltage wiring PL."

Referring to FIGS. 4 through 7, the display device according to the embodiment may include the base substrate 110, a wiring part, and the pixel PX.

The base substrate 110 includes a transparent insulating material and is capable of transmitting light. Since the base substrate 110 has been described above, a description of the base substrate 110 will be omitted.

The wiring part provides signals to the pixel PX and may include the scan lines Si−1, Si, and Si+1, the data line Dj, the emission control wiring Ei, the driving voltage wiring PL, and an initialization driving voltage wiring IPL.

The scan lines Si−1, Si, and Si+1 may extend in the first direction y. The scan lines Si−1, Si and Si+1 may include the $(i-1)^{th}$ scan line Si−1, the $i^{th}$ scan line Si, and the $(i+1)^{th}$ scan line Si+1 arranged sequentially along the second direction x intersecting the first direction y. Scan signals may be transmitted to the scan lines Si−1, Si, and Si+1. For example, an $(i-1)^{th}$ scan signal may be transmitted to the $(i-1)^{th}$ scan line Si−1, an $i^{th}$ scan signal may be transmitted to the $i^{th}$ scan line Si, and an $(i+1)^{th}$ scan signal may be transmitted to the $(i+1)^{th}$ scan line Si+1.

In one or more embodiments, three scan lines Si−1, Si, and Si+1 are provided to transmit the scan signals to the pixel PX. However, the scan signals can also be transmitted to the pixel PX through two scan lines Si−1 and Si. In this case, the $i^{th}$ scan line Si among the two scan lines Si−1 and Si may be branched into two lines, and the lines branched from the $i^{th}$ scan line Si may be connected to different transistors. For example, the $i^{th}$ scan line Si may include an upper $i^{th}$ scan line adjacent to the $(i-1)^{th}$ scan line Si-1, and a lower $i^{th}$ scan line located farther from the $(i-1)^{th}$ scan line Si-1 than the upper $i^{th}$ scan line.

The emission control wiring Ei extends in the first direction y and is disposed between the $i^{th}$ scan line Si and the $(i+1)^{th}$ scan line Si+1 to be separated or spaced apart from the $i^{th}$ scan line Si and the $(i+1)^{th}$ scan line Si+1. An emission control signal is transmitted to the emission control wiring Ei.

The data line Dj may extend in the second direction x. Each data line Dj may be sequentially arranged along the first direction y. A data signal (or a data voltage) may be provided to the data line Dj.

The driving voltage wiring PL may extend along the second direction x. The driving voltage wiring PL may be separated or spaced apart from the data line Dj. The driving voltage ELVDD (see FIG. 3) may be applied to the driving voltage wiring PL. The driving voltage wiring PL may be a double layer. For example, the driving voltage wiring PL may include a driving voltage line PLb and an additional driving voltage line PLa. The driving voltage line PLb may be disposed on the additional driving voltage line PLa to overlap the additional driving voltage line PLa when seen from above. The driving voltage line PLb may be electrically connected to the additional driving voltage line PLa through a twelfth contact hole CH12.

The initialization driving voltage wiring IPL may extend along the first direction y. The initialization driving voltage wiring IPL may be provided between the $(i+1)^{th}$ scan line Si+1 and the $(i-1)^{th}$ scan line Si-1 of a pixel in a next row. The initialization voltage Vint may be applied to the initialization driving voltage wiring IPL.

The pixel PX may include an organic light emitting diode OLED, a first transistor T1, a second transistor T2, a third transistor T3, a fourth transistor T4, a fifth transistor T5, a sixth transistor T6, a seventh transistor T7, and a storage capacitor Cst.

The first transistor T1 may include a first gate electrode GE1, a first active pattern ACT1, a first source electrode SE1, a first drain electrode DE1, and a first connection electrode CNL1.

The first gate electrode GE1 may be connected to a third drain electrode DE3 of the third transistor T3 and a fourth drain electrode DE4 of the fourth transistor T4. The first connection electrode CNL1 may connect the first gate electrode GE1 to the third drain electrode DE3 and the fourth drain electrode DE4. An end of the first connection electrode CNL1 may be connected to the first gate electrode GE1 through a first contact hole CH1, and the other end of the first connection electrode CNL1 may be connected to the third drain electrode DE3 and the fourth drain electrode DE4 through a second contact hole CH2.

In embodiments, the first active pattern ACT1, the first source electrode SE1, and the first drain electrode DE1 may be made of a semiconductor layer doped or undoped with impurities. For example, the first source electrode SE1 and the first drain electrode DE1 may be made of a semiconductor layer doped with impurities, and the first active pattern ACT1 may be made of the semiconductor layer undoped with the impurities. That is, one semiconductor layer may form the first active pattern ACT1, the first source electrode SE1, and the first drain electrode DE1, and may be divided into the first source electrode SE1, the first drain electrode DE1, and the first active pattern ACT1 according to whether it is doped with the impurities.

The first active pattern ACT1 may be shaped like a bar extending in a direction (e.g., a predetermined direction) and may be bent a plurality of times along the longitudinal extending direction. The first active pattern ACT1 may overlap the first gate electrode GE1 when seen from above. Since the first active pattern ACT1 is long, a channel region of the first transistor T1 may also be long. Accordingly, the driving range of a gate voltage applied to the first transistor T1 is widened, and thus the gray level of light emitted from the organic light emitting diode OLED can be finely controlled.

The first source electrode SE1 may be connected to an end of the first active pattern ACT1. The first source electrode SE1 may be connected to a second drain electrode DE2 of the second transistor T2 and a fifth drain electrode DE5 of the fifth transistor T5. The first drain electrode DE1 may be connected to the other end of the first active pattern ACT1. In addition, the first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, a second source electrode SE2, and the second drain electrode DE2.

The second gate electrode GE2 may be connected to the $i^{th}$ scan line Si. The second gate electrode GE2 may be provided as a part of the $i^{th}$ first scan line Si or may protrude from the $i^{th}$ scan line Si. In embodiments, the second active pattern ACT2, the second source electrode SE2, and the second drain electrode DE2 may be made of a semiconductor layer doped or undoped with impurities. For example, the second source electrode SE2 and the second drain electrode DE2 may be made of a semiconductor layer doped with impurities, and the second active pattern ACT2 may be made of the semiconductor layer undoped with the impurities. The second active pattern ACT2 overlaps the second gate electrode GE2. The second source electrode SE2 has an end connected to the second active pattern ACT2 and the other end connected to the data line Dj through a sixth contact hole CH6. The second drain electrode DE2 has an end connected to the second active pattern ACT2 and the other end connected to the first source electrode SE1 of the first transistor T1 and the fifth drain DE5 of the fifth transistor T5.

In some embodiments, the third transistor T3 may have a double gate structure in order to prevent or substantially prevent leakage current. That is, the third transistor T3 may include a $3a^{th}$ transistor T3a and a $3b^{th}$ transistor T3b. The $3a^{th}$ transistor T3a may include a $3a^{th}$ gate electrode GE3a, a $3a^{th}$ active pattern ACT3a, a $3a^{th}$ source electrode SE3a, and a $3a^{th}$ drain electrode DE3a. The $3b^{th}$ transistor T3b may include a $3b^{th}$ gate electrode GE3b, a $3b^{th}$ active pattern ACT3b, a $3b^{th}$ source electrode SE3b, and a $3b^{th}$ drain electrode DE3b. In the embodiments, for ease of description, the $3a^{th}$ gate electrode GE3a and the $3b^{th}$ gate electrode GE3b will be referred to as a third gate electrode GE3, the $3a^{th}$ active pattern ACT3a and the $3b^{th}$ active pattern ACT3b as a third active pattern ACT3, the $3a^{th}$ source electrode SE3a and the $3b^{th}$ source electrode SE3b as the third source electrode SE3, and the $3a^{th}$ drain electrode DE3a and the $3b^{th}$ drain electrode DE3b as the third drain electrode DE3.

The third gate electrode GE3 may be connected to the $i^{th}$ scan line Si. The third gate electrode GE3 may be provided as a part of the $i^{th}$ scan line Si or may protrude from the $i^{th}$ scan line Si.

The third active pattern ACT3, the third source electrode SE3, and the third drain electrode DE3 may be made of a semiconductor layer doped or undoped with impurities. For example, the third source electrode SE3 and the third drain electrode DE3 may be made of a semiconductor layer doped with impurities, and the third active pattern ACT3 may be made of the semiconductor layer undoped with the impurities. The third active pattern ACT3 overlaps the third gate electrode GE3. An end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. An end of the third drain electrode DE3 may be connected to the third active pattern ACT3. The other end of the third drain electrode DE3 may be connected to the fourth drain electrode DE4 of the fourth transistor T4. In addition, the third drain electrode DE3 may be connected to the first gate electrode GE1 of the first transistor T1 through the first connection electrode CNL1, the second contact hole CH2, and the first contact hole CH1.

The fourth transistor T4 may have a double gate structure in order to prevent or substantially prevent leakage current. That is, the fourth transistor T4 may include a $4a^{th}$ transistor T4a and a $4b^{th}$ transistor T4b. The $4a^{th}$ transistor T4a may include a $4a^{th}$ gate electrode GE4a, a $4a^{th}$ active pattern ACT4a, a $4a^{th}$ source electrode SE4a, and a $4a^{th}$ drain electrode DE4a. The $4b^{th}$ transistor T4b may include a $4b^{th}$ gate electrode GE4b, a $4b^{th}$ active pattern ACT4b, a $4b^{th}$ source electrode SE4b, and a $4b^{th}$ drain electrode DE4b. In the embodiments, for ease of description, the $4a^{th}$ gate electrode GE4a and the $4b^{th}$ gate electrode GE4b will be referred to as a fourth gate electrode GE4, the $4a^{th}$ active pattern ACT4a and the $4b^{th}$ active pattern ACT4b as a fourth active pattern ACT4, the $4a^{th}$ source electrode SE4a and the $4b^{th}$ source electrode SE4b as a fourth source electrode SE4, and the $4a^{th}$ drain electrode DE4a and the $4b^{th}$ drain electrode DE4b as the fourth drain electrode DE4.

The fourth gate electrode GE4 may be connected to the $(i-1)^{th}$ scan line Si-1. The fourth gate electrode GE4 may be provided as a part of the $(i-1)^{th}$ scan line Si-1 or may protrude from the $(i-1)^{th}$ scan line Si-1.

The fourth active pattern ACT4, the fourth source electrode SE4, and the fourth drain electrode DE4 may be made of a semiconductor layer doped or undoped with impurities. For example, the fourth source electrode SE4 and the fourth drain electrode DE4 may be made of a semiconductor layer doped with impurities, and the fourth active pattern ACT4 may be made of the semiconductor layer undoped with the impurities. The fourth active pattern ACT4 overlaps the fourth gate electrode GE4.

An end of the fourth source electrode SE4 may be connected to the fourth active pattern ACT4. The other end of the fourth source electrode SE4 may be connected to the initialization driving voltage wiring IPL of a pixel PX in the $(i-1)^{th}$ row and a seventh drain electrode DE7 of the seventh transistor T7 of the pixel PX in the $(i-1)^{th}$ row. An auxiliary connection wiring AUX may be provided between the fourth source electrode SE4 and the initialization driving voltage wiring IPL. An end of the auxiliary connection wiring AUX may be connected to the fourth source electrode SE4 through a ninth contact hole CH9. The other end of the auxiliary connection wiring AUX may be connected to the initialization driving voltage wiring IPL of the pixel PX in the $(i-1)^{th}$ row through an eighth contact hole CH8 of the pixel PX in the $(i-1)^{th}$ row. An end of the fourth drain electrode DE4 may be connected to the fourth active pattern ACT4. The other end of the fourth drain electrode DE4 may be connected to the third drain electrode DE3 of the third transistor T3. The fourth drain electrode DE4 is also connected to the first gate electrode GE1 of the first transistor T1 through the first connection electrode CNL1, the second contact hole CH2, and the first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the emission control wiring Ei. The fifth gate electrode GE5 may be provided as a part of the emission control wiring Ei or may protrude from the emission control wiring Ei. The fifth source electrode SE5 and the fifth drain electrode DE5 may be made of a semiconductor layer doped with impurities, and the fifth active pattern ACT5 may be made of the semiconductor layer undoped with the impurities. The fifth active pattern ACT5 overlaps the fifth gate electrode GE5. An end of the fifth source electrode SE5 may be connected to the fifth active pattern ACT5. The other end of the fifth source electrode SE5 may be connected to the driving voltage wiring PL through a fifth contact hole CH5. An end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode GE6 may be connected to the emission control wiring Ei. The sixth gate electrode GE6 may be provided as a part of the emission control wiring Ei or may protrude from the emission control wiring Ei. The sixth active pattern ACT6, the sixth source electrode SE6, and the sixth drain electrode DE6 may be made of a semiconductor layer doped or undoped with impurities. For example, the sixth source electrode SE6 and the sixth drain electrode DE6 may be made of a semiconductor layer doped with impurities, and the sixth active pattern ACT6 may be made of the semiconductor layer undoped with the impurities. The sixth active pattern ACT6 overlaps the sixth gate electrode GE6. An end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. An end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and the seventh drain electrode DE7.

The seventh gate electrode GE7 may be connected to the $(i+1)^{th}$ scan line Si+1. The seventh gate electrode GE7 may be provided as a part of the $(i+1)^{th}$ scan line Si+1 or may protrude from the $(i+1)^{th}$ scan line Si+1. The seventh active pattern ACT7, the seventh source electrode SE7, and the seventh drain electrode DE7 may be made of a semiconductor layer doped or undoped with impurities. For example, the seventh source electrode SE7 and the seventh drain electrode DE7 may be made of a semiconductor layer doped with impurities, and the seventh active pattern ACT7 may be made of the semiconductor layer undoped with the impurities. The seventh active pattern ACT7 overlaps the seventh gate electrode GE7. An end of the seventh source electrode SE7 may be connected to the seventh active pattern ACT7. The other end of the seventh source electrode SE7 may be connected to the sixth drain electrode DE6 of the sixth transistor T6. An end of the seventh drain electrode DE7 may be connected to the seventh active pattern ACT7. The other end of the seventh drain electrode DE7 may be connected to the initialization driving voltage wiring IPL. In addition, the seventh drain electrode DE7 may be connected to the fourth source electrode SE4 of the fourth transistor T4 of a pixel PX disposed in the (i+1)$^{th}$ row. The seventh drain electrode DE7 and the fourth source electrode SE4 of the fourth transistor T4 of the pixel PX disposed in the (i+1)$^{th}$ row may be connected through the auxiliary connection wiring AUX, the eighth contact hole CH8, and the ninth contact hole CH9.

The storage capacitor Cst may include a lower electrode LE and an upper electrode UE. The lower electrode LE may be made of the first gate electrode GE1 of the first transistor T1.

The upper electrode UE may overlap the lower electrode LE and cover the lower electrode LE when seen from above. The capacitance of the storage capacitor Cst can be increased by widening the overlap area between the upper electrode UE and the lower electrode LE. The upper electrode UE may extend in the first direction y. In embodiments, a voltage having the same level as the driving voltage ELVDD may be applied to the upper electrode UE. The upper electrode UE may have an opening OPN in an area where the first contact hole CH1 is located. The first gate electrode GE1 and the first connection electrode CNL1 are connected through the first contact hole CH1.

The organic light emitting diode OLED which is a self-luminous element may include an anode AD, a cathode CD, and a light emitting layer EML provided between the anode AD and the cathode CD.

The anode AD may be provided in a light emitting area corresponding to each pixel PX. The anode AD may be connected to the seventh source electrode SE7 of the seventh transistor T7 and the sixth drain electrode DE6 of the sixth transistor T6 through a seventh contact hole CH7 and a tenth contact hole CH10. A second connection electrode CNL2 and a bridge pattern BRP may be provided between the seventh contact hole CH7 and the tenth contact hole CH10 to connect the sixth drain electrode DE6 and seventh source electrode SE7 to the anode AD.

Herein, the structure of the display device according to embodiments will be described in a stacking order with reference to FIGS. 5 through 7.

The active patterns ACT1 through ACT7 (herein, indicated by "ACT") may be provided on the base substrate 110. The active patterns ACT may include the first through seventh active patterns ACT1 through ACT7. The first through seventh active patterns ACT1 through ACT7 may be made of a semiconductor material.

A buffer layer 111 may be provided between the base substrate 110 and the active patterns ACT. The buffer layer 111 may be an inorganic insulating layer containing an inorganic material, such as silicon oxide (SiOx), silicon nitride (SiNx), and/or silicon oxynitride (SiON).

A gate insulating layer 130 may be located on the base substrate 110 having the active patterns ACT. The gate insulating layer 130 may be an inorganic insulating layer containing an inorganic material, such as silicon oxynitride (SiON), silicon oxide (SiOx), and/or silicon nitride (SiNx).

The scan lines Si-1, Si, and Si+1, the emission control wiring Ei, and the first through seventh gate electrodes GE1 through GE7 may be provided on the gate insulating layer 130. The first gate electrode GE1 may be the lower electrode LE of the storage capacitor Cst. The second gate electrode GE2 and the third gate electrode GE3 may be formed integrally with the i$^{th}$ scan line Si. The fourth gate electrode GE4 may be formed integrally with the (i-1)$^{th}$ scan line Si-1. The fifth gate electrode GE5 and the sixth gate electrode GE6 may be formed integrally with the emission control wiring Ei. The seventh gate electrode GE7 may be formed integrally with the (i+1)$^{th}$ scan line Si+1.

In embodiments, the scan lines Si-1, Si, and Si+1, the emission control wiring Ei, the first gate electrode GE1, and the seventh gate electrode GE7 may be made of the same material (for example, a first conductive material) and may be disposed on the same layer. For example, the scan lines Si-1, Si, and Si+1, the emission control wiring Ei, the first gate electrode GE1, and the seventh gate electrode GE7 may be made of the first conductive material, such as molybdenum (Mo), aluminum (Al), copper (Cu), or titanium (Ti), and may each have a multilayer structure or a single-layer structure.

When elements are disposed on the same layer, they are located at the same level. In addition, when the elements are disposed on the same layer, it denotes that they were stacked in the same order on the base substrate 110 and formed concurrently (e.g., simultaneously) in the same process.

A first lower insulating layer 150 may be provided on the base substrate 110 having the scan lines Si-1, Si, and Si+1, and the like.

The upper electrode UE of the storage capacitor Cst and the initialization driving voltage wiring IPL may be provided on the first lower insulating layer 150. The upper electrode UE may cover the lower electrode LE. The upper electrode UE and the lower electrode LE may form the storage capacitor Cst with the first lower insulating layer 150 interposed between them.

The upper electrode UE and the initialization driving voltage wiring IPL may be made of the same material and disposed on the same layer. For example, the upper electrode UE and the initialization driving voltage wiring IPL may include molybdenum (Mo), aluminum (Al), copper (Cu), or titanium (Ti) and may each be formed as a multilayer or a single layer.

A second lower insulating layer 170 may be provided on the base substrate 110 having the upper electrode UE and the initialization driving voltage wiring IPL.

Each of the first lower insulating layer 150 and the second lower insulating layer 170 may be an inorganic insulating layer containing an inorganic material, such as silicon oxynitride (SiON), silicon oxide (SiOx), and/or silicon nitride (SiNx).

The data line Dj, the additional driving voltage line PLa of the driving voltage wiring PL, the first connection electrode CNL1, the second connection electrode CNL2, and the auxiliary connection wiring AUX may be provided on the second lower insulating layer 170.

The data line Dj may be connected to the second source electrode SE2 through the sixth contact hole CH6 sequentially passing through the gate insulating layer 130, the first lower insulating layer 150, and the second lower insulating layer 170.

The additional driving voltage line PLa of the driving voltage wiring PL may be connected to the upper electrode UE of the storage capacitor Cst through third and fourth contact holes CH3 and CH4 passing through the second lower insulating layer 170. In addition, the additional driving voltage line PLa of the driving voltage wiring PL may be connected to the fifth source electrode SE5 through the fifth contact hole CH5 sequentially passing through the gate insulating layer 130, the first lower insulating layer 150, and the second lower insulating layer 170.

The first connection electrode CNL1 may be connected to the first gate electrode GE1 through the first contact hole CH1 sequentially passing through the first lower insulating layer 150 and the second lower insulating layer 170. In addition, the first connection electrode CNL1 may be connected to the third drain electrode DE3 and the fourth drain electrode DE4 through the second contact hole CH2 sequentially passing through the gate insulating layer 130, the first lower insulating layer 150, and the second lower insulating layer 170.

The second connection electrode CNL2 may be a pattern provided as a medium disposed between the sixth drain electrode DE6 and the anode AD to connect the sixth drain electrode DE6 and the anode AD. The second connection electrode CNL2 may be connected to the sixth drain electrode DE6 and the seventh source electrode SE7 through the seventh contact hole CH7 sequentially passing through the gate insulating layer 130, the first lower insulating layer 150, and the second lower insulating layer 170.

The auxiliary connection wiring AUX may be connected to the initialization driving voltage wiring IPL through the eighth contact hole CH8 passing through the second lower insulating layer 170. In addition, the auxiliary connection wiring AUX may be connected to the fourth source electrode SE4 and the seventh drain electrode DE7 of the pixel PX disposed in the (i−1)$^{th}$ row through the ninth contact hole CH9 sequentially passing through the gate insulating layer 130, the first lower insulating layer 150, and the second lower insulating layer 170.

In embodiments, the data line Dj, the additional driving voltage line PLa, the first connection electrode CNL1, the second connection electrode CNL2, and the auxiliary connection wiring AUX may be made of the same material (for example, a second conductive material) and may be disposed on the same layer. For example, the data line Dj, the additional driving voltage line PLa, the first connection electrode CNL1, the second connection electrode CNL2, and the auxiliary connection wiring AUX may be made of the second conductive material, such as molybdenum (Mo), aluminum (Al), copper (Cu) or titanium (Ti), and may each be formed as a multilayer or a single layer. In some alternative embodiments, the data line Dj, the additional driving voltage line PLa, the first connection electrode CNL1, the second connection electrode CNL2, and the auxiliary connection wiring AUX may have a multilayer structure of Ti/Al/Ti.

A first upper insulating layer 210 may be provided on the base substrate 110 having the data lines Dj and the like.

The bridge pattern BRP and the driving voltage line PLb of the driving voltage wiring PL may be disposed on the first upper insulating layer 210.

The bridge pattern BRP may be connected to the second connection electrode CNL2 through the tenth contact hole CH10 passing through the first upper insulating layer 210.

The driving voltage line PLb of the driving voltage wiring PL may be connected to the additional driving voltage line PLa through the twelfth contact hole CH12 passing through the first upper insulating layer 210.

In embodiments, the bridge pattern BRP and the driving voltage line PLb may be made of the same material (for example, a third conductive material) and may be disposed on the same layer. For example, the bridge pattern BRP and the driving voltage line PLb may be made of the third conductive material, such as molybdenum (Mo), aluminum (Al), copper (Cu), or titanium (Ti), and may each be formed as a multilayer or a single layer. In some alternative embodiments, the bridge pattern BRP and the driving voltage line PLb may have a multilayer structure of Ti/Al/Ti.

A second upper insulating layer 230 may be provided on the base substrate 110 having the bridge pattern BRP and the like.

Each of the first upper insulating layer 210 and the second upper insulating layer 230 may be an organic insulating layer containing an organic material. In embodiments, the organic material may be an imide polymer, a general common polymer such as polymethylmethacrylate (PMMA) or polystyrene (PS), a polymer derivative having a phenolic group, an acrylic polymer, an aryl-ether polymer, an amide polymer, a fluoric polymer, a p-xylene polymer, a vinyl alcohol polymer, or a blend of these materials.

The anode AD may be located on the second upper insulating layer 230. The anode AD may be connected to the bridge pattern BRP through an eleventh contact hole CH11 passing through the second upper insulating layer 230. Since the bridge pattern BRP is connected to the second connection electrode CNL2 through the tenth contact hole CH10, the anode AD may be finally connected to the sixth drain electrode DE6 and the seventh source electrode SE7 through the bridge pattern BRP and the second connection electrode CNL2.

A pixel defining layer 250 may be located on the base substrate 110 having the anode AD to define a light emitting area corresponding to each pixel PX. The pixel defining layer 250 may expose an upper surface of the anode AD and protrude from the base substrate 110 along the periphery of each pixel PX. The pixel defining layer 250 may include an organic material, such as polyimide, or hexamethyldisiloxane (HMDSO).

The light emitting layer EML may be provided in an area surrounded by the pixel defining layer 250, and the cathode CD may be provided on the light emitting layer EML.

The encapsulation layer 300 may be located on the cathode electrode CD to cover the cathode CD. The encapsulation layer 300 may include the first inorganic layer 310 located on the cathode CD, the organic layer 330 located on the first inorganic layer 310, and the second inorganic layer 350 located on the organic layer 330.

Figure 8:
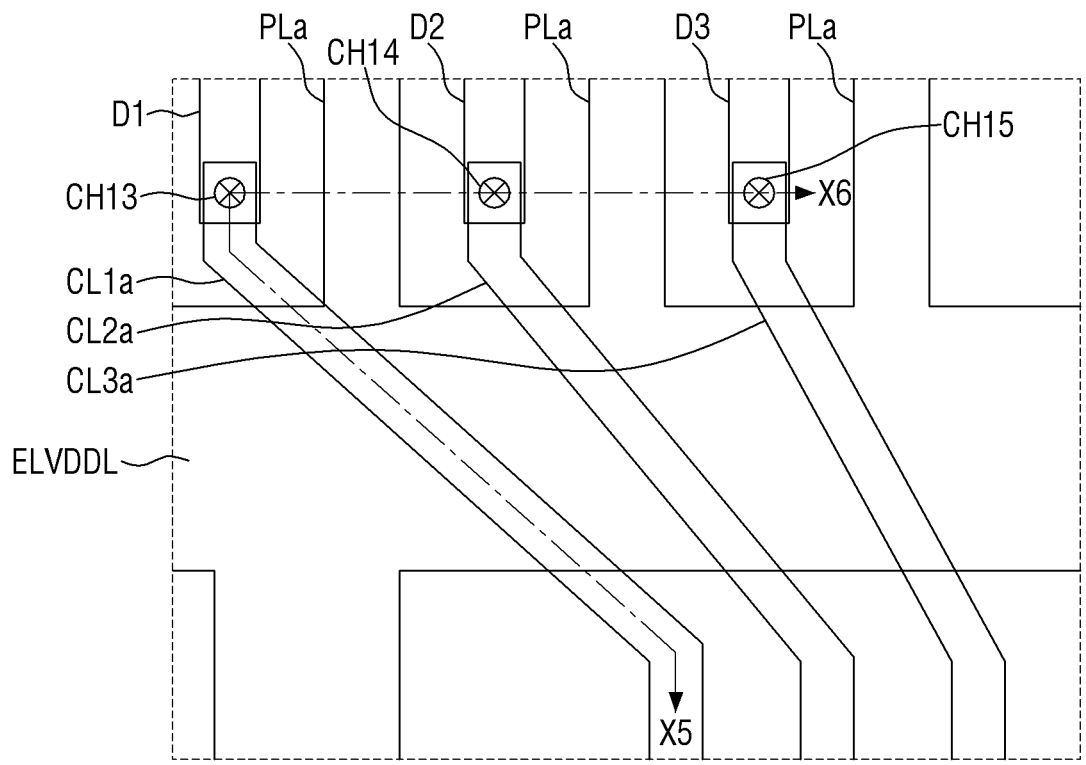
FIG. 8 is an enlarged plan view of a region "Q1" of FIG. 1.
Figure 9:
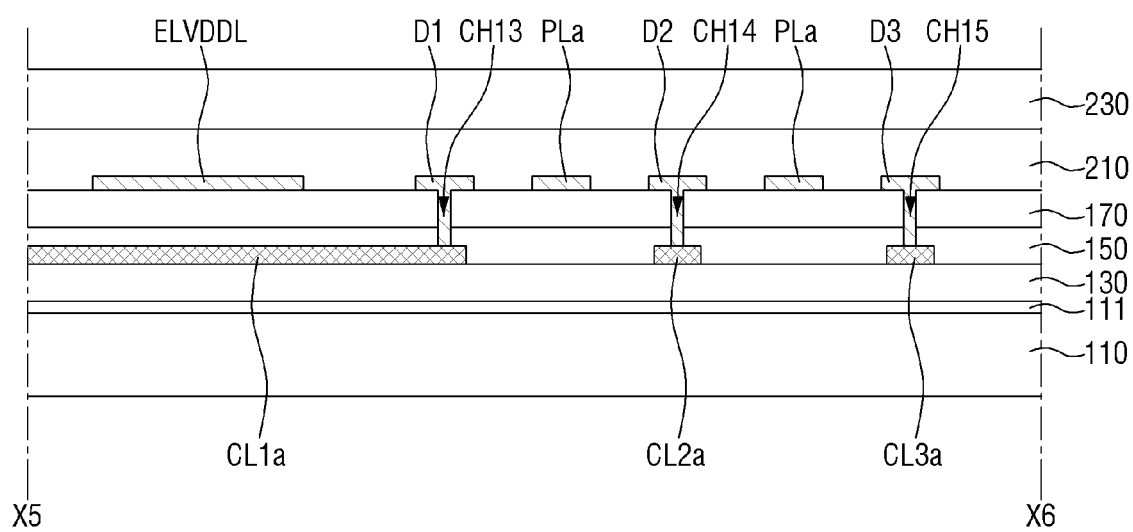
FIG. 9 is a cross-sectional view taken along the line X5-X6 of FIG. 8.
Figure 10:
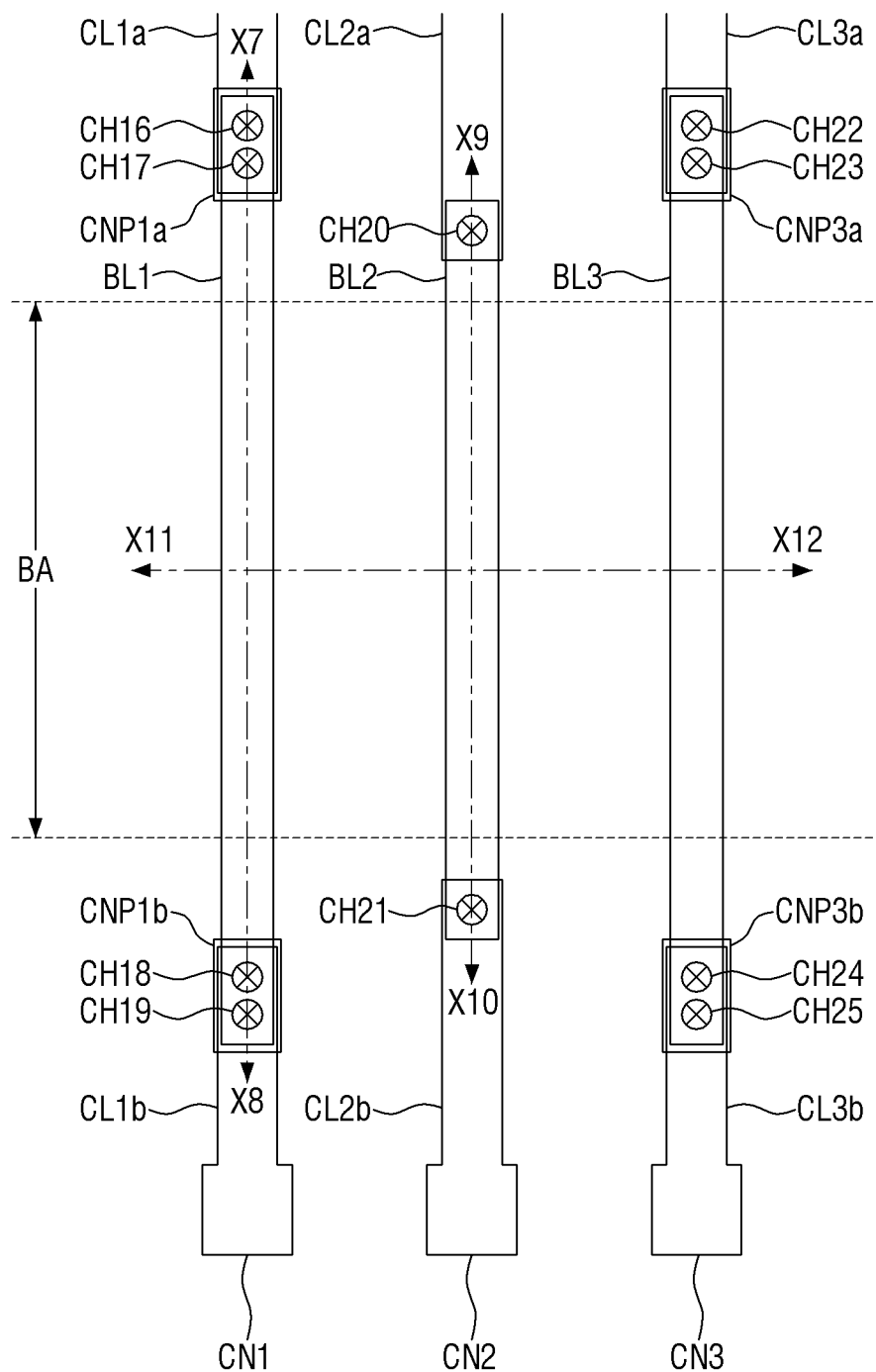
FIG. 10 is an enlarged plan view of a region "Q2" of FIG. 1.
Figure 11:
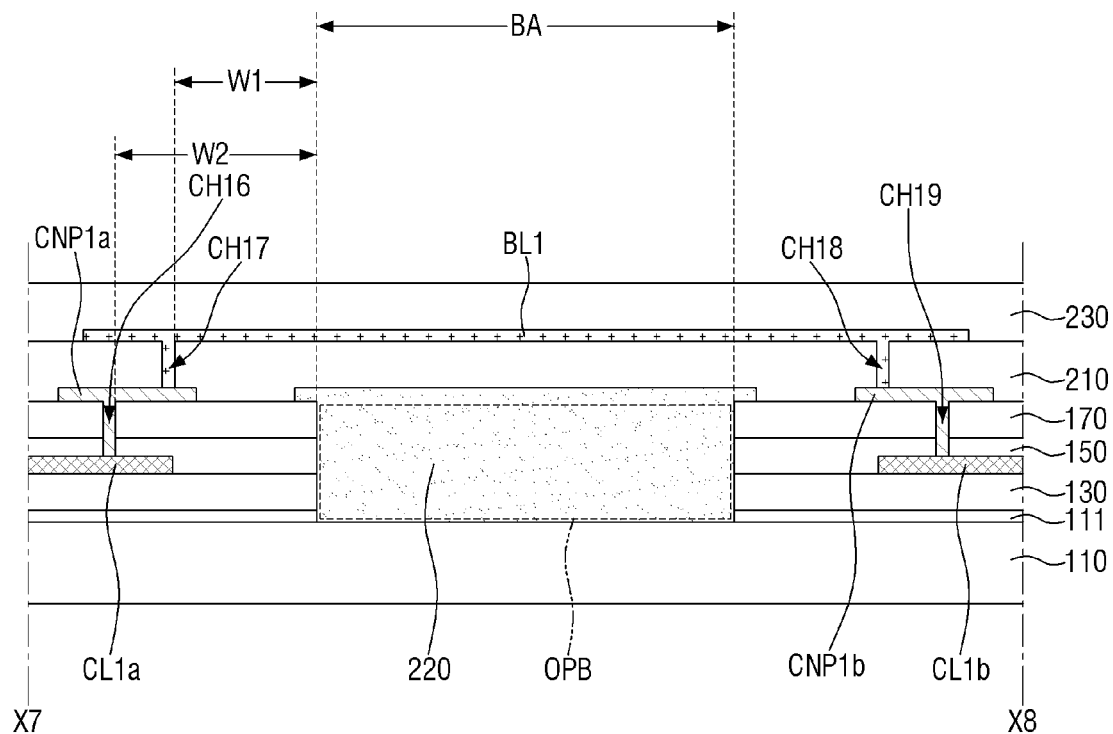
FIG. 11 is a cross-sectional view taken along the line X7-X8 of FIG. 10.
Figure 12:
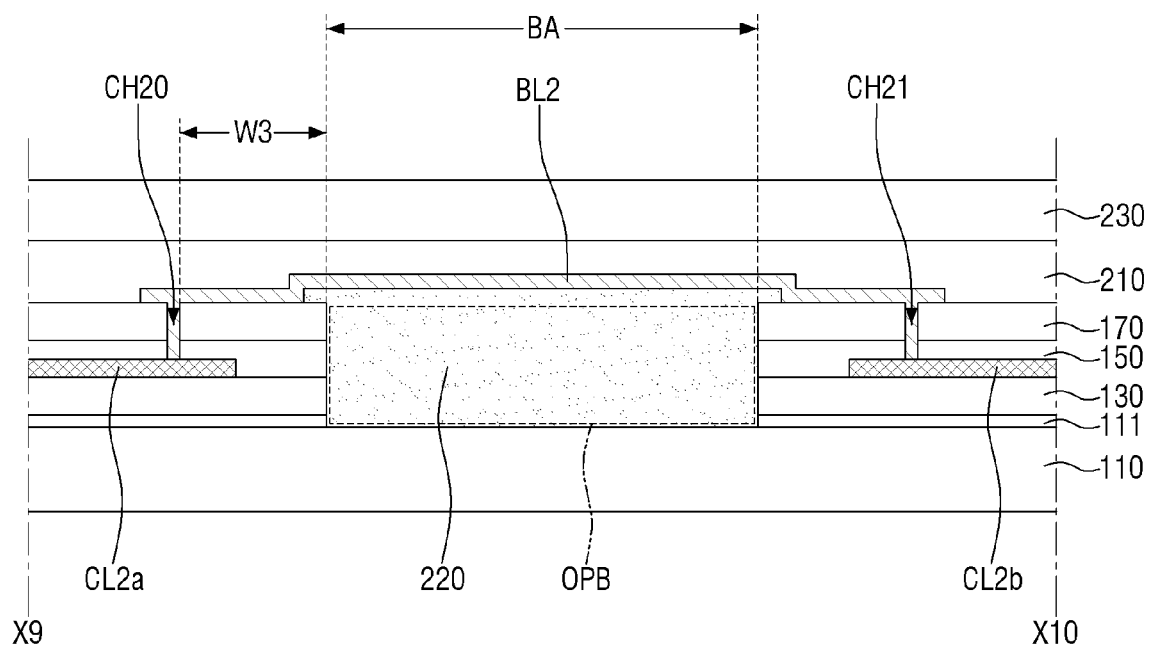
FIG. 12 is a cross-sectional view taken along the line X9-X10 of FIG. 10.
Figure 13:
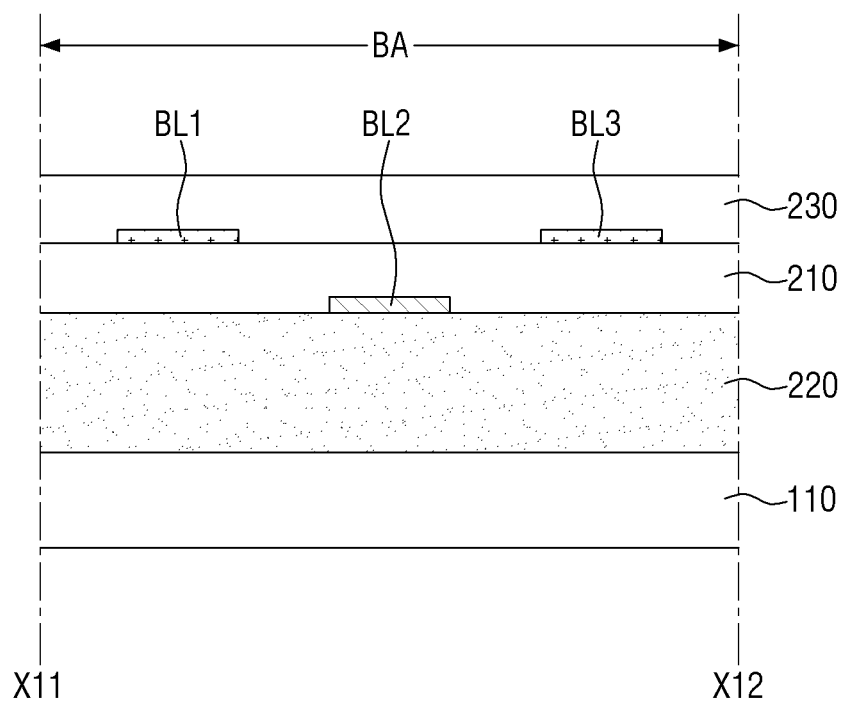
FIG. 13 is a cross-sectional view taken along the line X11-X12 of FIG. 10.

FIG. 8 is an enlarged plan view of a region "Q1" of FIG. 1. FIG. 9 is a cross-sectional view taken along the line X5-X6 of FIG. 8. FIG. 10 is an enlarged plan view of a region "Q2" of FIG. 1. FIG. 11 is a cross-sectional view taken along the line X7-X8 of FIG. 10. FIG. 12 is a cross-sectional view taken along the line X9-X10 of FIG. 10. FIG. 13 is a cross-sectional view taken along the line X11-X12 of FIG. 10.

Referring to FIGS. 1 and 8 through 13, the additional driving voltage line PLa extends up to the peripheral area NDA along the second direction x to be connected to the driving voltage supply wiring ELVDDL. In some embodiments, the driving voltage supply wiring ELVDDL may be located on the same layer as the additional driving voltage line PLa. For example, the driving voltage supply wiring ELVDDL may be located on the second lower insulating layer 170.

If data lines sequentially arranged along the second direction x among a plurality of data lines are referred to as the first data line D1, the second data line D2, and the third data line D3, the first data line D1, the second data line D2, and the third data line D3 may extend up to the peripheral area NDA along the second direction x and may be separated or spaced apart from the driving voltage supply wiring ELVDDL.

The first connection wiring part CL1 (see FIG. 1) electrically connects the first data line D1 and a first connection pad CN1 among the connection pads CN on the peripheral area NDA. The second connection wiring part CL2 (see FIG. 1) electrically connects the second data line D2 and the second connection pad CN2 on the peripheral area NDA, and the third connection wiring part CL3 (see FIG. 1) electrically connects the third data line D3 and the third connection pad CN3 on the peripheral area NDA.

The first connection wiring part CL1 (see FIG. 1) includes a first connection wiring CL1a, a second connection wiring CL1b, a first connection pattern CNP1a, a second connection pattern CNP1b, and the first bridge wiring BL1. The second connection wiring part CL2 (see FIG. 1) includes a third connection wiring CL2a, a fourth connection wiring CL2b, and the second bridge wiring BL2. In addition, the third connection wiring part CL3 (see FIG. 1) includes a fifth connection wiring CL3a, a sixth connection wiring CL3b, a third connection pattern CNP3a, a fourth connection pattern CNP3b, and the third bridge wiring BL3.

The buffer layer 111 and the gate insulating layer 130 are located on the peripheral area NDA of the base substrate 110, and the first connection wiring CL1a, the third connection wiring CL2a, and the fifth connection wiring CL3a are disposed on the gate insulating layer 130 to be separated or spaced apart from each other. The first connection wiring CL1a, the third connection wiring CL2a, and the fifth connection wiring CL3a are insulated from and intersect the driving voltage supply wiring ELVDDL. The first connection wiring CL1a, the third connection wiring CL2a, and the fifth connection wiring CL3a may be located on the peripheral area NDA of the base substrate 110 but may not overlap the bending area BA. In addition, both sides of each of the first connection wiring CL1a, the third connection wiring CL2a, and the fifth connection wiring CL3a may be located further out than edges of the driving voltage supply wiring ELVDDL when seen from above without overlapping the driving voltage supply wiring ELVDDL.

The second connection wiring CL1b, the fourth connection wiring CL2b, and the sixth connection wiring CL3b are located on the gate insulating layer 130 to be separated or spaced apart from each other. The second connection wiring CL1b may be separated or spaced apart from the first connection wiring CL1a by the bending area BA interposed between them and may be connected to the first connection pad CN1. In some embodiments, a portion of the second connection wiring CL1b may constitute the first connection pad CN1. Like the second connection wiring CL1b, the fourth connection wiring CL2b may be separated or spaced apart from the third connection wiring CL2a by the bending area BA interposed between them and may be connected to the second connection pad CN2. In some embodiments, a portion of the fourth connection wiring CL2b may constitute the second connection pad CN2. In addition, the sixth connection wiring CL3b may be separated or spaced apart from the fifth connection wiring CL3a by the bending area BA interposed between them and may be connected to the third connection pad CN3. In some embodiments, a portion of the sixth connection wiring CL3b may constitute the third connection pad CN3.

In embodiments, the first connection wiring CL1a, the second connection wiring CL1b, the third connection wiring CL2a, the fourth connection wiring CL2b, the fifth connection wiring CL3a, and the sixth connection wiring CL3b may be made of the same first conductive material as the scan lines Si-1, Si, and Si+1 and may be disposed on the same layer as the scan lines Si-1, Si, and Si+1. In embodiments, the first conductive material may include molybdenum (Mo), aluminum (Al), copper (Cu), or titanium (Ti) as described above.

The first lower insulating layer 150 and the second lower insulating layer 170 may be located on the first connection wiring CL1a, the second connection wiring CL1b, the third connection wiring CL2a, the fourth connection wiring CL2b, the fifth connection wiring CL3a, and the sixth connection wiring CL3b.

The first data line D1, the second data line D2, the third data line D3, and the driving voltage supply wiring ELVDDL may be located on the second lower insulating layer 170. The first data line D1 is connected to a side of the first connection wiring CL1a through a thirteenth contact hole CH13 passing through the first lower insulating layer 150 and the second lower insulating layer 170. The second data line D2 is connected to a side of the third connection wiring CL2a through a fourteenth contact hole CH14 passing through the first lower insulating layer 150 and the second lower insulating layer 170. The third data line D3 is connected to a side of the third connection wiring CL2a through a fifteenth contact hole CH15 passing through the first lower insulating layer 150 and the second lower insulating layer 170.

The first connection pattern CNP1a, the second connection pattern CNP1b, the third connection pattern CNP3a, the fourth connection pattern CNP3b, and the second bridge wiring BL2 separated from each other are located on the second lower insulating layer 170.

The first connection pattern CNP1a is connected to the other side of the first connection wiring CL1a through a sixteenth contact hole CH16 passing through the first lower insulating layer 150 and the second lower insulating layer 170. The third connection pattern CNP3a is connected to the other side of the third connection wiring CL3a through a twenty-second contact hole CH22 passing through the first lower insulating layer 150 and the second lower insulating layer 170.

The second connection pattern CNP1b is connected to the second connection wiring CL1b through a nineteenth contact hole CH19 passing through the first lower insulating layer 150 and the second lower insulating layer 170. The fourth connection pattern CNP3b is connected to the sixth connection wiring CL3b through a twenty-fifth contact hole CH25 passing through the first lower insulating layer 150 and the second lower insulating layer 170.

Referring to the peripheral area NDA around the bending area BA, each of the buffer layer 111, the gate insulating layer 130, the first lower insulating layer 150, and the second lower insulating layer 170 disposed on the base substrate 110 may be made of an inorganic insulating layer as described above.

In some embodiments, inorganic insulating layers such as the buffer layer 111, the gate insulating layer 130, the first lower insulating layer 150, and the second lower insulating layer 170 may have an opening OPB corresponding to the bending area BA.

The inorganic insulating layers 110, 130, 150, and 170 have significantly low flexibility and can be broken by an external force due to their brittleness. Therefore, the inorganic insulating layers 110, 130, 150, and 170 of the bending area BA can be broken by a tensile force generated due to bending, and the resulting cracks may propagate to other parts. The cracks generated in the inorganic insulating layers 110, 130, 150, and 170 may cause breaking of wirings, which may lead to the failure of the display device.

According to embodiments, the inorganic insulating layers 110, 130, 150, and 170 include the opening OPB corresponding to the bending area BA to prevent the occurrence of cracks due to stress or reduce the probability of crack occurrence. In some embodiments, the opening OPB may extend along a direction (e.g., the first direction y) parallel to the bending axis.

A stress relieving layer 220 may be disposed in the opening OPB corresponding to the bending area BA. The stress relieving layer 220 is made of a material having lower brittleness and higher flexibility than the inorganic insulating layers 110, 130, 150, and 170. For example, the stress relieving layer 220 may be made of an organic insulating material and may include at least one of polyimide, acrylate, and epoxy. The stress relieving layer 220 may fill the entire opening OPB and may be in close contact with sidewalls of the opening OPB to prevent or substantially prevent the formation of a gap between the stress relieving layer 220 and the insulating layer 110, 130, 150, and 170.

The second bridge wiring BL2 traverses the bending area BA and is connected to the third connection wiring CL2a and the fourth connection wiring CL2b.

The second bridge wiring BL2 is connected to a side of the third connection wiring CL2a through a twentieth contact hole CH20 passing through the first lower insulating layer 150 and the second lower insulating layer 170 and is connected to the fourth connection wiring CL2b through a twenty-first contact hole CH21 passing through the first lower insulating layer 150 and the second lower insulating layer 170.

A portion of the second bridge wiring BL2 which overlaps the bending area BA may be located on the stress relieving layer 220.

In embodiments, the first connection pattern CNP1a, the second connection pattern CNP1b, the third connection pattern CNP3a, the fourth connection pattern CNP3b, and the second bridge wiring BL2 may be made of the same second conductive material as the first through third data lines D1 through D3 and may be disposed at the same level as the first through third data lines D1 through D3. In embodiments, the second conductive material may include molybdenum (Mo), aluminum (Al), copper (Cu), or titanium (Ti), and may be formed as a multilayer or a single layer.

The first upper insulating layer 210 is located on the first connection pattern CNP1a, the second connection pattern CNP1b, the third connection pattern CNP3a, the fourth connection pattern CNP3b, the second bridge wiring BL2, and the stress relieving layer 220.

The first bridge wiring BL1 and the third bridge wiring BL3 are located on the first upper insulating layer 210.

The first bridge wiring BL1 traverses the bending area BA and is connected to the first connection pattern CNP1a and the second connection pattern CNP1b. In addition, the third bridge wiring BL3 traverses the bending area BA and is connected to the third connection pattern CNP3a and the fourth connection pattern CNP3b.

A side of the first bridge wiring BL1 is connected to the first connection pattern CNP1a through a seventeenth contact hole CH17 passing through the first upper insulating layer 210, and the other side of the first bridge wiring BL1 is connected to the second connection pattern CNP1b through an eighteenth contact hole CH18 passing through the first upper insulating layer 210.

A side of the third bridge wiring BL3 is connected to the third connection pattern CNP3a through a twenty-third contact hole CH23 passing through the first upper insulating layer 210, and the other side of the third bridge wiring BL3 is connected to the fourth connection pattern CNP3b through a twenty-fourth contact hole CH24 passing through the first upper insulating layer 210.

In some embodiments, the first bridge wiring BL1 and the third bridge wiring BL3 are made of the same third conductive material as the driving voltage line PLb and may be disposed on the same layer as the driving voltage line PLb. The third conductive material may include molybdenum (Mo), aluminum (Al), copper (Cu), or titanium (Ti), and may be formed as a multilayer or a single layer.

The first bridge wiring BL1 and the second bridge wiring BL2 neighboring each other along the first direction y on the bending area BA are located on different layers with the first upper insulating layer 210 interposed between them. In addition, the second bridge wiring BL2 and the third bridge wiring BL3 neighboring each other along the first direction y are located on different layers with the first upper insulating layer 210 interposed between them. Therefore, a short circuit between neighboring bridge wirings on the bending area BA can be prevented or substantially prevented, and the bridge wirings can be separated or spaced apart by a small gap when seen from above.

Contact holes adjacent along the first direction y may not lie on the same straight line but may be arranged in a zig-zag form. For example, assuming that an imaginary line extends along the first direction y, the seventeenth contact hole CH17 for connecting the first bridge wiring BL1 and the first connection pattern CNP1a and/or the sixteenth contact hole CH16 for connecting the first connection pattern CNP1a and the first connection wiring CL1a and the twentieth contact hole CH20 for connecting the second bridge wiring BL2 and the third connection wiring CL2a may not be located on the imaginary line.

Alternatively, assuming that a shortest distance between the bending area BA and the seventeenth contact hole CH17 measured along the second direction x is W1, a shortest distance between the bending area BA and the sixteenth contact hole CH16 is W2, and a shortest distance between the bending area BA and the twentieth contact hole CH20 is W3, W3 may be different from W1 and W2. Accordingly, it is possible to prevent or substantially prevent an unintended short circuit between elements neighboring each other along the first direction y in the vicinity of the contact holes and improve the reliability of the display device.

Figure 14:
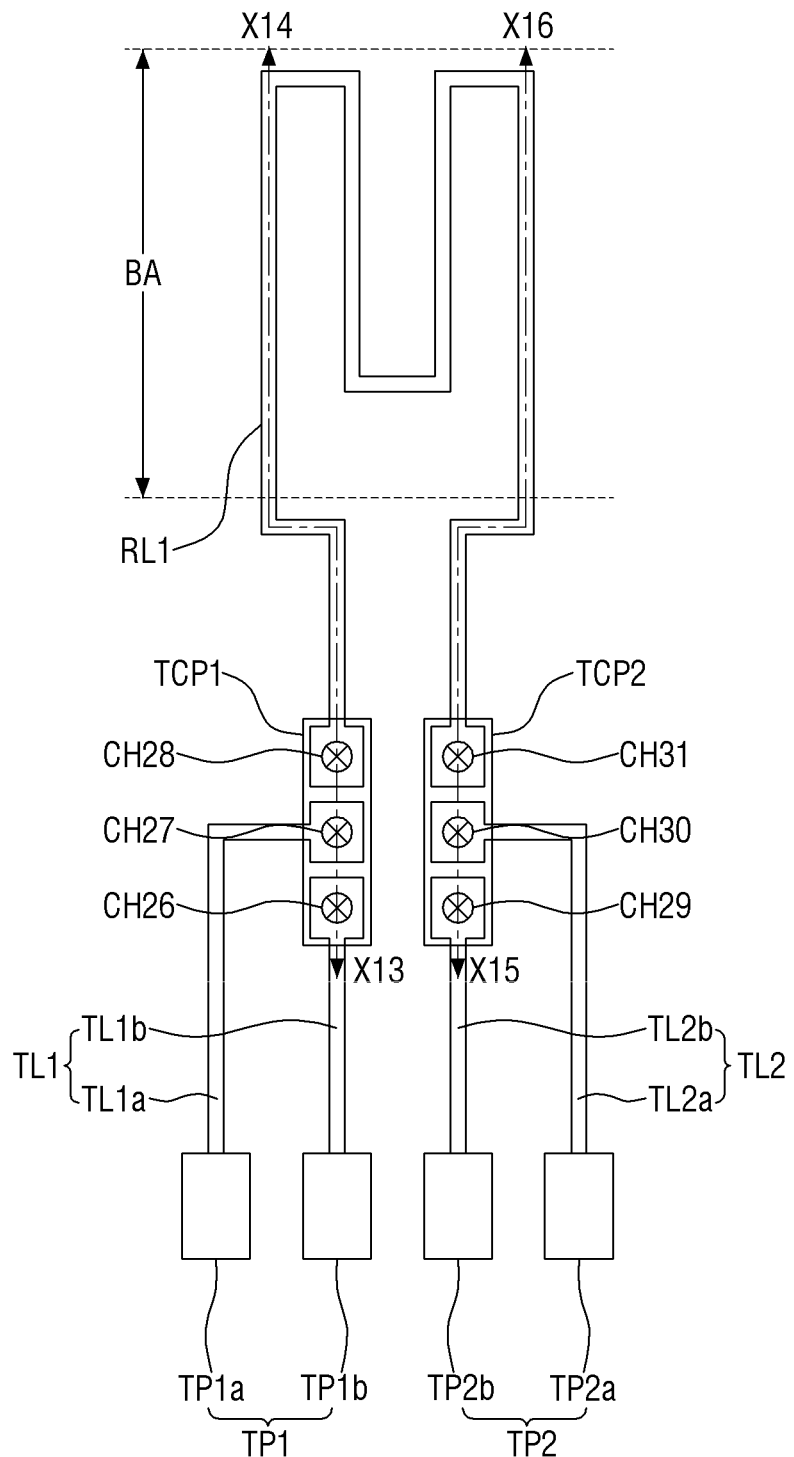
FIG. 14 is an enlarged plan view of a region "Q3" of FIG. 1.
Figure 15:
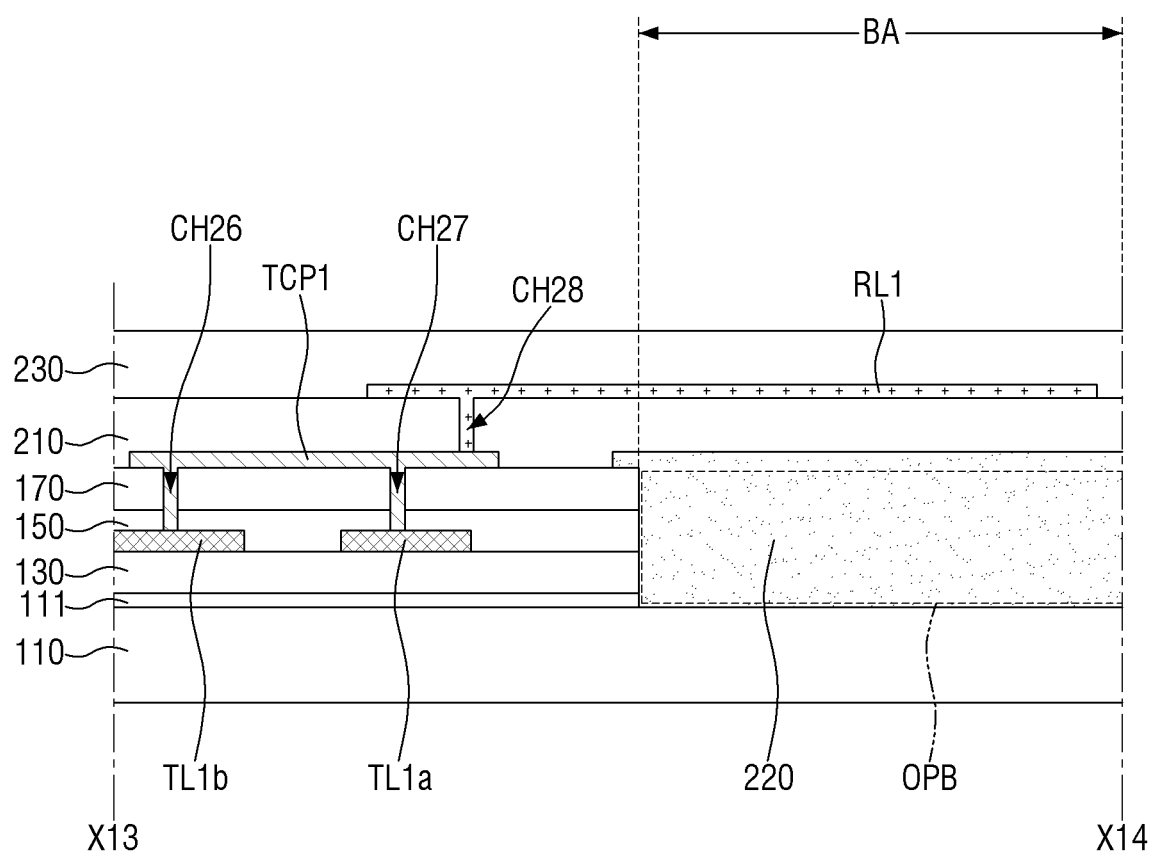
FIG. 15 is a cross-sectional view taken along the line X13-X14 of FIG. 14.
Figure 16:
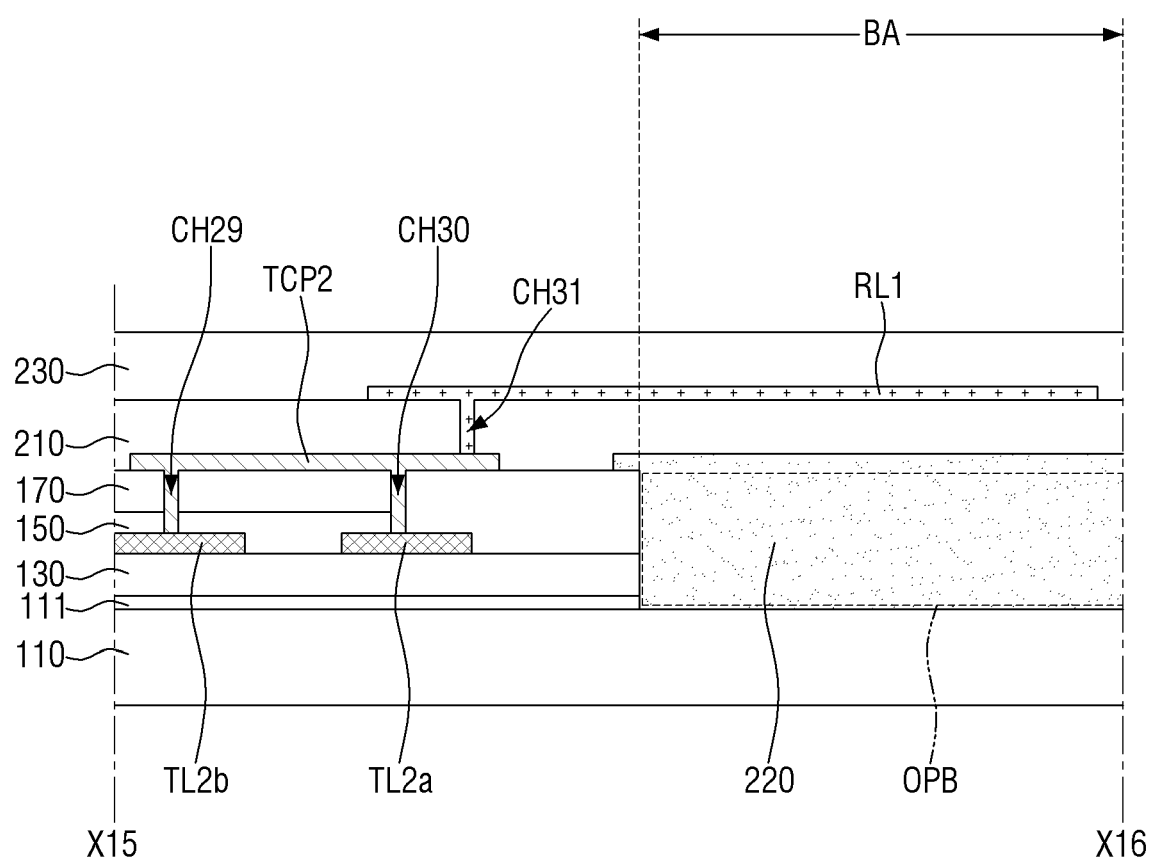
FIG. 16 is a cross-sectional view taken along the line X15-X16 of FIG. 14.

FIG. 14 is an enlarged plan view of a region "Q3" of FIG. 1. FIG. 15 is a cross-sectional view taken along the line X13-X14 of FIG. 14. FIG. 16 is a cross-sectional view taken along the line X15-X16 of FIG. 14.

Referring to FIGS. 1 and 14 through 16, the buffer layer 111 and the gate insulating layer 130 are located on the peripheral area NDA of the base substrate 110, and the first test signal line TL1 and the second test signal line TL2 are disposed on the gate insulating layer 130 to be separated or spaced apart from each other. The first test signal line TL1 is connected to the first test pad TP1, and the second test signal line TL2 is connected to the second test pad TP2.

In some embodiments, the first test pad TP1 may be part of the first test signal line TL1, and the second test pad TP2 may be part of the second test signal line TL2.

The first test signal line TL1 and the second test signal line TL2 may not overlap the bending area BA of the base substrate 110. If the first test signal line TL1 and the second test signal line TL2 overlap the bending area BA of the base substrate 110, it may be difficult to determine whether a crack has occurred in the first crack detection line RL1 or in the first test signal line TL1 and the second test signal line TL2. Therefore, the first test signal line TL1 and the second test signal line TL2 may not overlap the bending area BA of the base substrate 110 in order to prevent or substantially prevent the first test signal line TL1 and the second test signal line TL2 from being damaged by the bending of the display device.

In some embodiments, the first test signal line TL1 may include the first sub-test signal line TL1a and the second sub-test signal line TL1b. The first sub-test signal line TL1a and the second sub-test signal line TL1b may be separated or spaced apart from each other as illustrated in the drawings. However, the inventive concept is not limited to this case. In an embodiment, the first sub-test signal line TL1a and the second sub-test signal line TL1b may be partially connected to each other.

The second test signal line TL2 may include the third sub-test signal line TL2a and the fourth sub-test signal line TL2b. The third sub-test signal line TL2a and the fourth sub-test signal line TL2b may be separated or spaced apart from each other as illustrated in the drawings. However, the inventive concept is not limited to this case.

The first test pad TP1 may include the first sub-test pad TP1a connected to the first sub-test signal line TL1a and the second sub-test pad TP1b connected to the second sub-test signal line TL1b.

The second test pad TP2 may include the third sub-test pad TP2a connected to the third sub-test signal line TL2a and the fourth sub-test pad TP2b connected to the fourth sub-test signal line TL2b. In some embodiments, the first sub-test pad TP1a, the second sub-test pad TP1b, the third sub-test pad TP2a, and the fourth sub-test pad TP2b may be separated or spaced apart from each other.

In embodiments, like the first connection wiring CL1a, the second connection wiring CL1b, the third connection wiring CL2a, the fourth connection wiring CL2b, the fifth connection wiring CL3a, and the sixth connection wiring CL3b, the first test signal line TL1 and the second test signal line TL2 may be made of the same first conductive material as the scan lines Si−1, Si, and Si+1 and may be disposed on the same layer as the scan lines Si−1, Si, and Si+1. In embodiments, the first conductive material may include molybdenum (Mo), aluminum (Al), copper (Cu), or titanium (Ti) as described above.

The first lower insulating layer 150 and the second lower insulating layer 170 may be located on the first test signal line TL1 and the second test signal line TL2.

A first test connection pattern TCP1 and a second test connection pattern TCP2 may be located on the second lower insulating layer 170 to be separated or spaced apart from each other.

The first test connection pattern TCP1 and the second test connection pattern TCP2 are elements for improving connection reliability. The first test connection pattern TCP1 may be connected to the second sub-test signal line TL1b through a twenty-sixth contact hole CH26 passing through the first lower insulating layer 150 and the second lower insulating layer 170 and may be connected to the first sub-test signal line TL1a through a twenty-seventh contact hole CH27 passing through the first lower insulating layer 150 and the second lower insulating layer 170. The second test connection pattern TCP2 may be connected to the fourth sub-test signal line TL2b through a twenty-ninth contact hole CH29 passing through the first lower insulating layer 150 and the second lower insulating layer 170 and may be connected to the fourth sub-test signal line TL2a through a thirtieth contact hole CH30 passing through the first lower insulating layer 150 and the second lower insulating layer 170.

In embodiments, like the first connection pattern CNP1a, the second connection pattern CNP1b, the third connection pattern CNP3a, the fourth connection pattern CNP3b, and the second bridge wiring BL2, the first test connection pattern TCP1 and the second test connection pattern TCP2 may be made of the same second conductive material as the first through third data lines D1 through D3 and may be located at the same level as the first through third data lines D1 through D3.

The first upper insulating layer 210 may be located on the first test connection pattern TCP1, the second test connection pattern TCP2, and the stress relieving layer 220.

The first crack detection line RL1 may be located on the first upper insulating layer 210.

The first crack detection line RL1 includes a portion overlapping the bending area BA and is connected to the first test connection pattern TCP1 and the second test connection pattern TCP2.

A side of the first crack detection line RL1 is connected to the first test connection pattern TCP1 through a twenty-eighth contact hole CH28 passing through the first upper insulating layer 210, and the other side of the first crack detection line RL1 is connected to the second test connection pattern TCP2 through a thirty-first contact hole CH31 passing through the first upper insulating layer 210.

A portion of the first crack detection line RL1 which overlaps the bending area BA may include a plurality of bent portions.

In some embodiments, the first crack detection line RL1, like the first bridge wiring BL1 and the third bridge wiring BL3, may be made of the same third conductive material as the driving voltage line PLb and may be disposed on the same layer as the driving voltage line PLb. In embodiments, the third conductive material may include molybdenum (Mo), aluminum (Al), copper (Cu), or titanium (Ti), and may be formed as a multilayer or a single layer.

Figure 17:
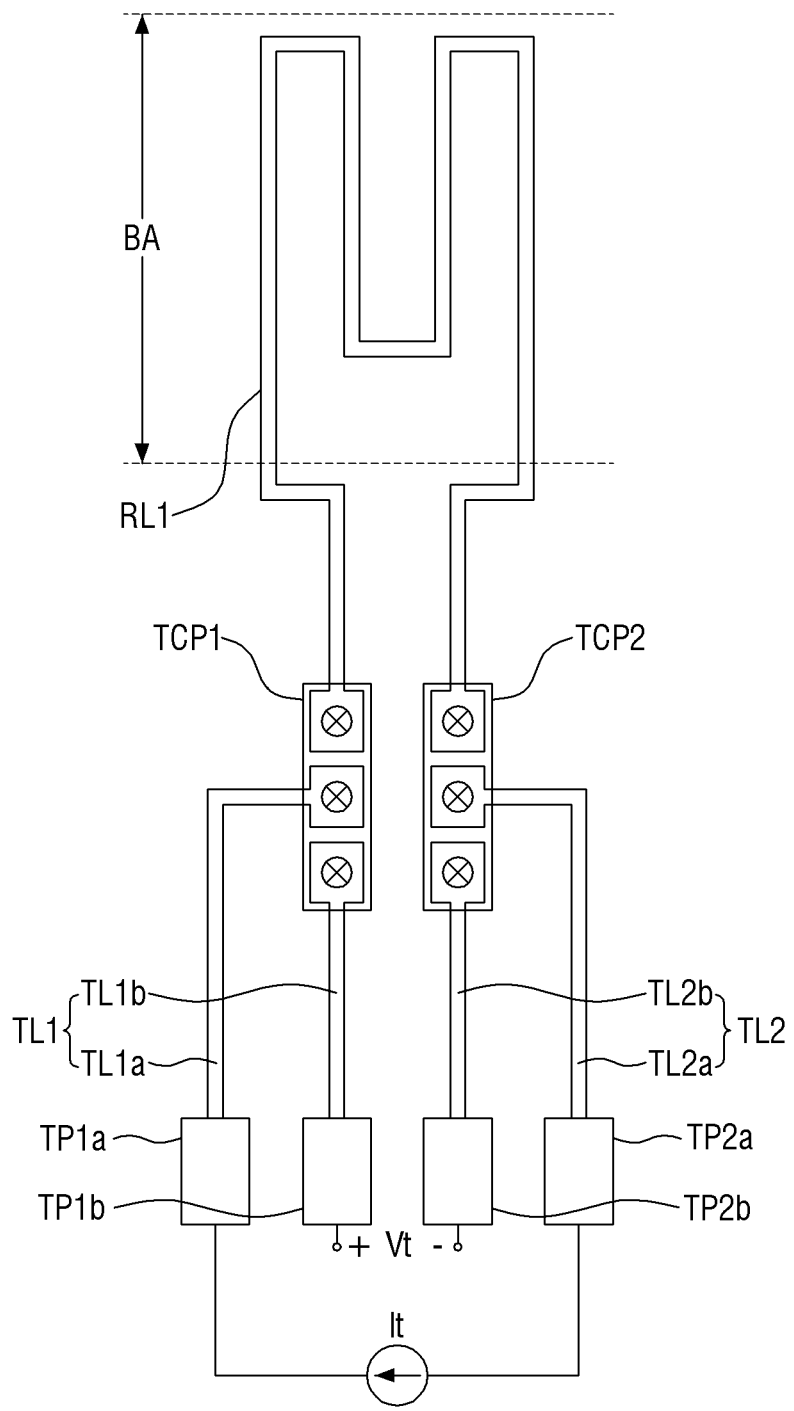
FIG. 17 is a view for explaining a process of detecting a crack using the structure illustrated in FIG. 14.

FIG. 17 is a view for explaining a process of detecting a crack using the structure illustrated in FIG. 14.

Referring to FIG. 17, before the display device is bent, a pair of test signal probes are brought into contact with the first sub-test pad TP1a and the third sub-test pad TP2a to provide a test signal to the first crack detection line RL1. In addition, a pair of output signal probes are brought into contact with the second sub-test pad TP1b and the fourth sub-test pad TP2b to measure an output signal generated in response to the test signal. In an example, a current It may be provided to the first crack detection line RL1 as the test signal, a voltage Vt may be measured as the output signal, and the current It (i.e. the test signal) and the voltage Vt (i.e. the output signal) may be compared to obtain a resistance value.

After the display device is bent, the current It may be provided to the first crack detection line RL1 as the test signal, and the voltage Vt may be measured as the output signal to obtain a resistance value. Then, whether the first crack detection line RL1 has cracked may be detected by comparing the resistance value before the bending of the display device and the resistance value after the bending of the display device.

Among the wirings located on the bending area BA, elements located relatively further out or elements located farther from the base substrate 110 are relatively more likely to crack. For example, since the first bridge wiring BL1 and the third bridge wiring BL3 are located relatively higher than the second bridge wiring BL2 on the base substrate 110, the first bridge wiring BL1 and the third bridge wiring BL3 are relatively more likely to crack than the second bridge wiring BL2.

According to the current embodiment, when a crack is detected in the first crack detection line RL1, the probability that elements located on the bending area BA, in particular, the first bridge wiring BL1 and the third bridge wiring BL3 located at the same level as the first crack detection line RL1, will crack can be estimated based on the crack generated in the first crack detection line RL1. Therefore, it is possible to easily detect a malfunction due to a crack that may potentially occur in the display device by using the first crack detection line RL1 during the process of manufacturing the display device.

In addition, according to the current embodiment, the first sub-test pad TP1a and the third sub-test pad TP2a are provided as test signal input pads, and the second sub-test pad TP1b and the fourth sub-test pad TP2b separated or spaced apart from the first sub-test pad TP1a and the third sub-test pad TP2a are provided as output signal measurement pads. Therefore, a test can be easily performed using a total of four probes. In particular, since a test signal input process and an output signal acquisition process can be performed concurrently (e.g., simultaneously), the test can be performed more easily and quickly.

Figure 18:
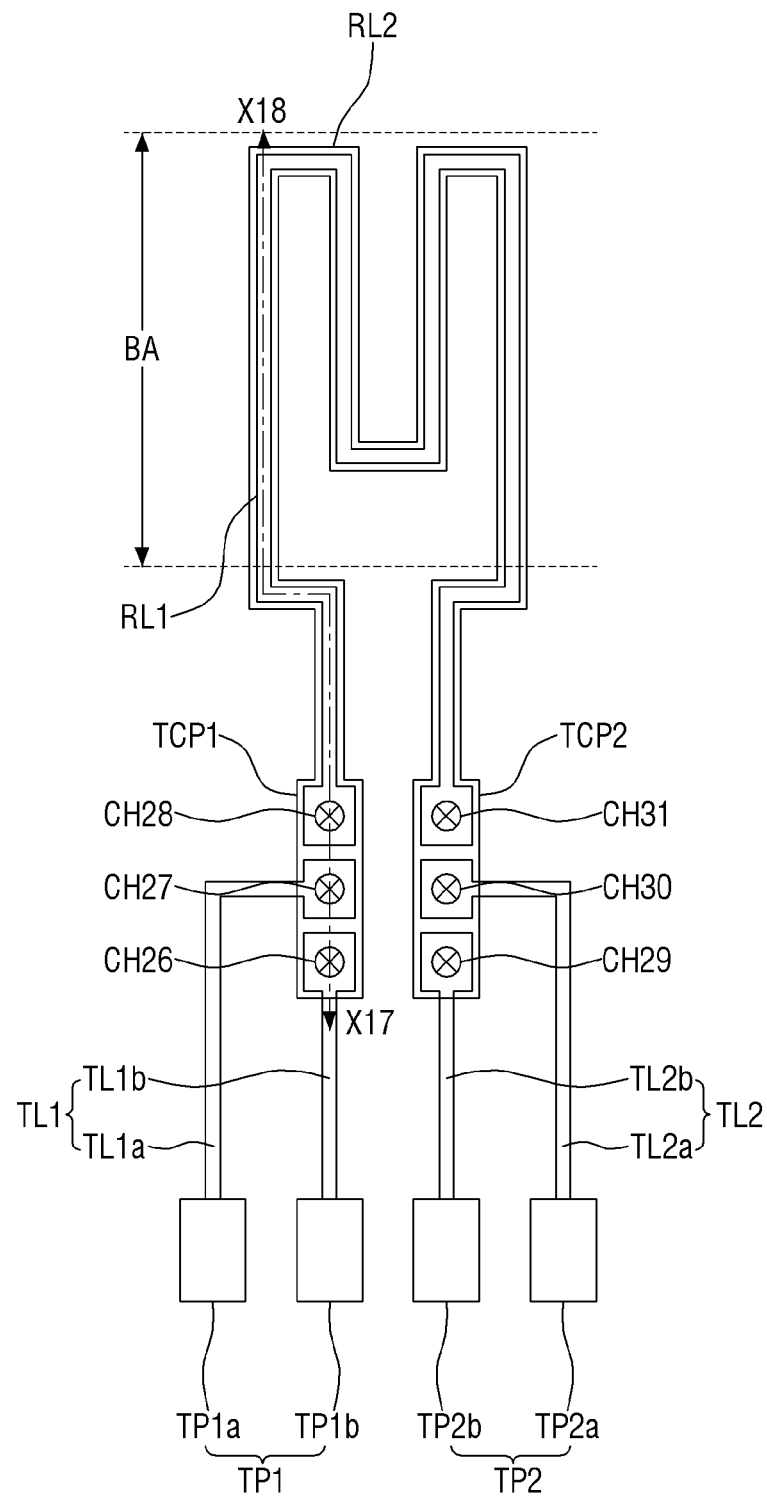
FIG. 18 is a plan view of a modified example of the structure illustrated in FIG. 14.
Figure 19:
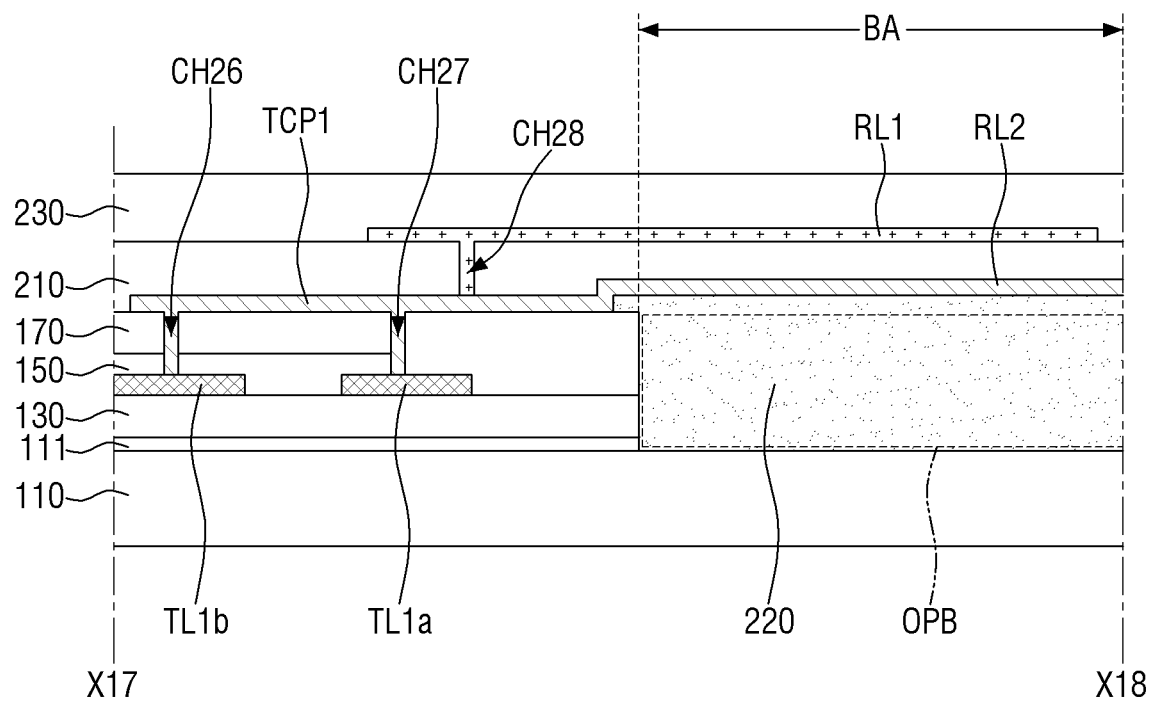
FIG. 19 is a cross-sectional view taken along the line X17-X18 of FIG. 18.

FIG. 18 is a plan view of a modified example of the structure illustrated in FIG. 14. FIG. 19 is a cross-sectional view taken along the line X17-X18 of FIG. 18. The current modified example is substantially the same as the structure of FIG. 14, except that a second crack detection line RL2 is further provided. Therefore, differences from the structure of FIG. 14 will be mainly described below.

Referring to FIGS. 18 and 19, the second crack detection line RL2 is located on the second lower insulating layer 170 such that at least a portion of the second crack detection line RL2 overlaps the bending area BA. A side of the second crack detection line RL2 is connected to a first test connection pattern TCP1, and the other side of the second crack detection line RL2 is connected to a second test connection pattern TCP2.

In embodiments, like the first test connection pattern TCP1 and the second test connection pattern TCP2, the second crack detection line RL2 may be made of the same second conductive material as the first through third data lines D1 through D3 and may be located at the same level as the first through third data lines D1 through D3.

A portion of the second crack detection line RL2 which overlaps the bending area BA may include a plurality of bent portions, and the second crack detection line RL2 overlapping the bending area BA may be located on the stress relieving layer 220.

A test process of the current embodiment may be substantially the same as the method described above with reference to FIG. 17.

According to the current embodiment, the probability that the first bridge wiring BL1 and the third bridge wiring BL3 located at the same level as a first crack detection line RL1 will crack can be estimated. In addition, the probability that an element (e.g., the second bridge wiring BL2) located at the same level as the second crack detection line RL2 will crack can be estimated.

Figure 20:
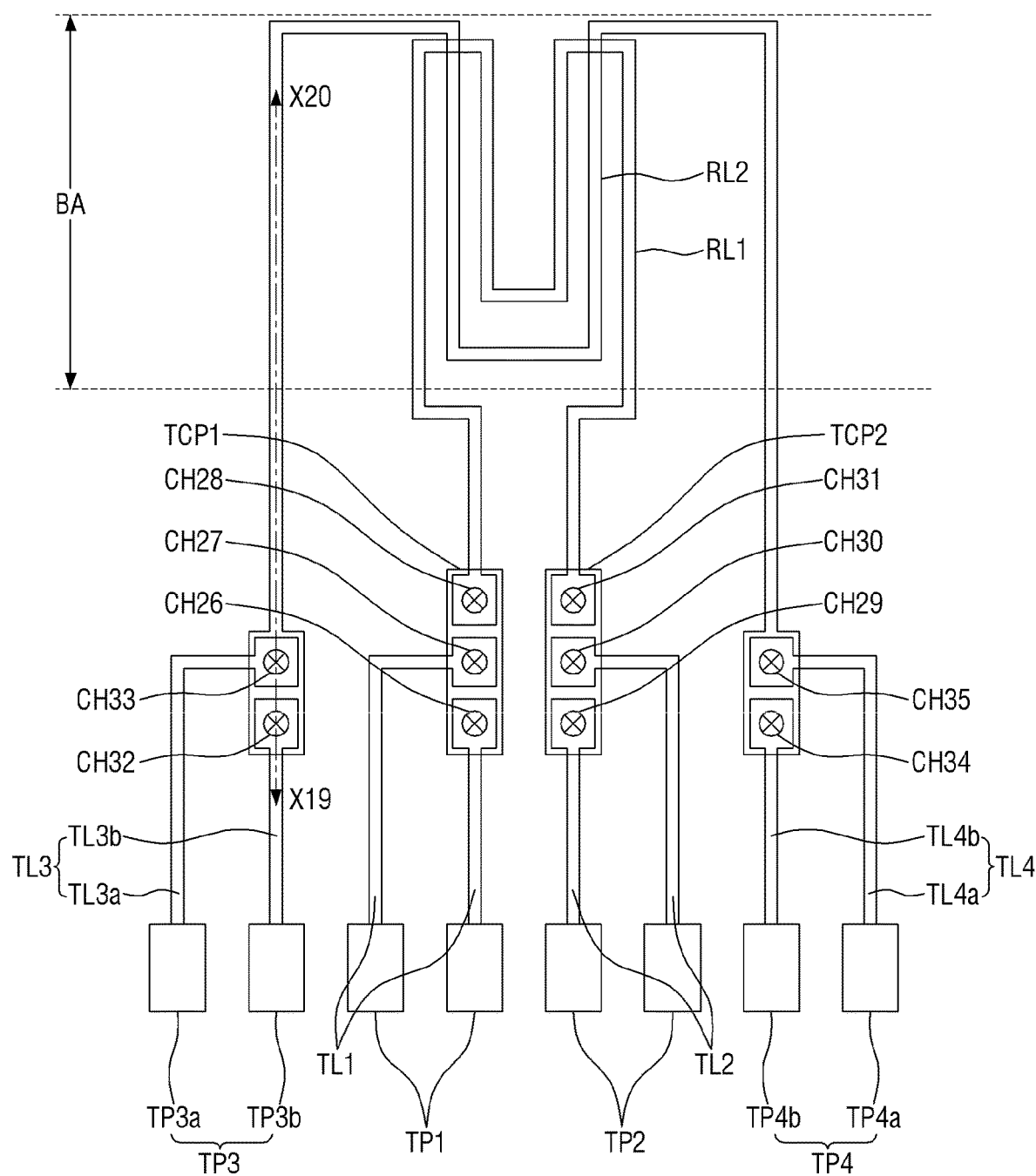
FIG. 20 is a plan view of a modified example of the structure illustrated in FIG. 14.
Figure 21:
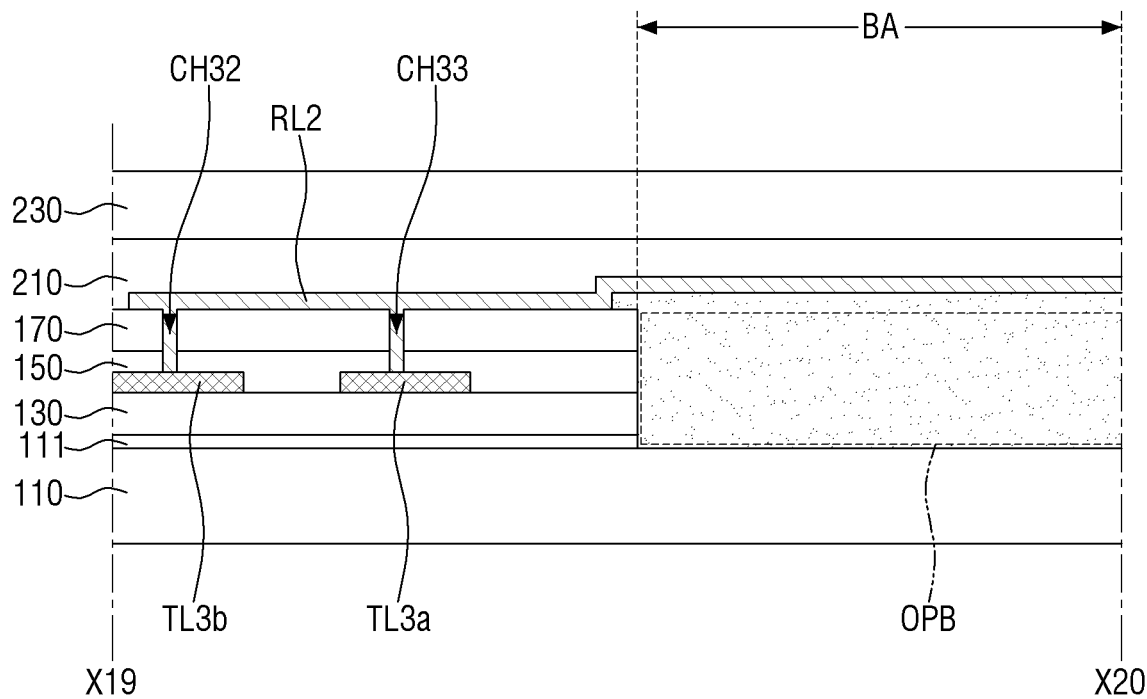
FIG. 21 is a cross-sectional view taken along the line X19-X20 of FIG. 20.

FIG. 20 is a plan view of a modified example of the structure illustrated in FIG. 14. FIG. 21 is a cross-sectional view taken along the line X19-X20 of FIG. 20. The current modified example is substantially the same as the structure of FIG. 14, except that a third test signal line TL3, a fourth test signal line TL4, a third test pad TP3, a fourth test pad TP4, and a second crack detection line RL2 are further provided. Therefore, differences from the structure of FIG. 14 will be mainly described below.

Referring to FIGS. 1, 20, and 21, the buffer layer 111 and the gate insulating layer 130 are disposed on the peripheral area NDA of the base substrate 110, and the third test signal line TL3 and the fourth test signal line TL4 separated or spaced apart from each other are located on the gate insulating layer 130. The third test signal line TL3 and the fourth test signal line TL4 are separated or spaced apart from a first test signal line TL1 and a second test signal line TL2.

The third test signal line TL3 is connected to the third test pad TP3, and the fourth test signal line TL4 is connected to the fourth test pad TP4. In some embodiments, the third test pad TP3 may be part of the third test signal line TL3, and the fourth test pad TP4 may be part of the fourth test signal line TL4.

In some embodiments, the third test signal line TL3 may include a fifth sub-test signal line TL3a and a sixth sub-test signal line TL3b. The fifth sub-test signal line TL3a and the sixth sub-test signal line TL3b may be separated or spaced apart from each other as illustrated in the drawings. However, the inventive concept is not limited to this case. In an embodiment, the fifth sub-test signal line TL3a and the sixth sub-test signal line TL3b may be partially connected to each other.

The fourth test signal line TL4 may include a seventh sub-test signal line TL4a and an eighth sub-test signal line TL4b. The seventh sub-test signal line TL4a and the eighth sub-test signal line TL4b may be, but not necessarily, separated or spaced apart from each other as illustrated in the drawings.

The third test pad TP3 may include a fifth sub-test pad TP3a connected to the fifth sub-test signal line TL3a and a sixth sub-test pad TP3b connected to the sixth sub-test signal line TL3b.

The fourth test pad TP4 may include a seventh sub-test pad TP4a connected to the seventh sub-test signal line TL4a and an eighth sub-test pad TP4b connected to the eighth sub-test signal line TL4b.

In some embodiments, the fifth sub-test pad TP3a and the sixth sub-test pad TP3b may be separated or spaced apart from the seventh sub-test pad TP4a and the eighth sub-test pad TP4b.

In embodiments, like the first test signal line TL1 and the second test signal line TL2, the third test signal line TL3 and the fourth test signal line TL4 may be made of the same first conductive material as the scan lines Si−1, Si, and Si+1, and may be disposed on the same layer as the scan lines Si−1, Si, and Si+1. In embodiments, the first conductive material may include molybdenum (Mo), aluminum (Al), copper (Cu), or titanium (Ti) as described above.

The first lower insulating layer 150 and the second lower insulating layer 170 may be located on the first test signal line TL1, the second test signal line TL2, the third test signal line TL3, and the fourth test signal line TL4.

The second crack detection line RL2 is located on the second lower insulating layer 170 such that at least a portion of the second crack detection line RL2 overlaps the bending area BA. One side of the second crack detection line RL2 is connected to the fifth sub-test signal line TL3a and the sixth sub-test signal line TL3b, and the other side of the second crack detection line RL2 is connected to the seventh sub-test signal line TL4a and the eighth sub-test signal line TL4b.

The one side of the second crack detection line RL2 may be connected to the sixth sub-test signal line TL3b through a thirty-second contact hole CH32 passing through the first lower insulating layer 150 and the second lower insulating layer 170 and may be connected to the fifth sub-test signal line TL3a through a thirty-third contact hole CH33 passing through the first lower insulating layer 150 and the second lower insulating layer 170.

The other side of the second crack detection line RL2 may be connected to the eighth sub-test signal line TL4b through a thirty-fourth contact hole CH34 passing through the first lower insulating layer 150 and the second lower insulating layer 170 and may be connected to the seventh sub-test signal line TL4a through a thirty-fifth contact hole CH35 passing through the first lower insulating layer 150 and the second lower insulating layer 170.

A portion of the second crack detection line RL2 which overlaps the bending area BA may include a plurality of bent portions, and the second crack detection line RL2 overlapping the bending area BA may be located on the stress relieving layer 220.

In embodiments, like a first test connection pattern TCP1 and a second test connection pattern TCP2, the second crack detection line RL2 may be made of the same second conductive material as the first through third data lines D1 through D3 and may be located at the same level as the first through third data lines D1 through D3.

Figure 22:
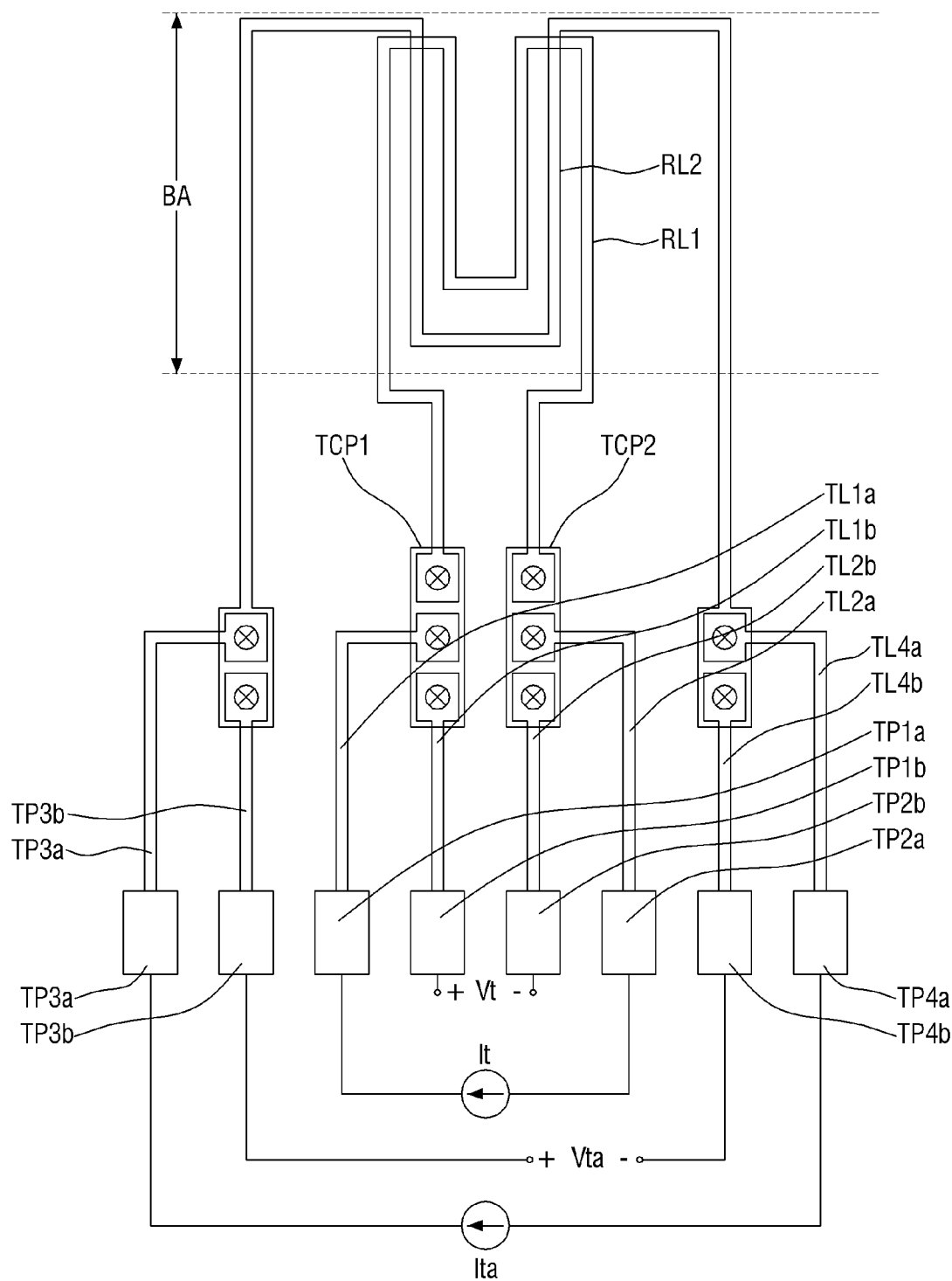
FIG. 22 is a view for explaining a process of detecting a crack using the structure illustrated in FIG. 20.

FIG. 22 is a view for explaining a process of detecting a crack using the structure illustrated in FIG. 20.

Referring to FIG. 22, before the display device is bent, a pair of test signal probes are brought into contact with a first sub-test pad TP1a and a third sub-test pad TP2a to provide a test signal to a first crack detection line RL1. In addition, a pair of output signal probes are brought into contact with a second sub-test pad TP1b and a fourth sub-test pad TP2b to measure an output signal generated in response to the test signal. In an example, a current It may be provided to the first crack detection line RL1 as the test signal, a voltage Vt may be measured as the output signal, and the current It (i.e. the test signal) and the voltage Vt (i.e. the output signal) may be compared to obtain a resistance value.

After the display device is bent, the current It may be provided to the first crack detection line RL1 as the test signal, and the voltage Vt may be measured as the output signal to obtain a resistance value. Then, whether the first crack detection line RL1 has cracked may be detected by comparing the resistance value before the bending of the display device and the resistance value after the bending of the display device.

In addition, before the display device is bent, another pair of test signal probes are brought into contact with the fifth sub-test pad TP3a and the seventh sub-test pad TP4a to provide a test signal to the second crack detection line RL2. In addition, another pair of output signal probes are brought into contact with the sixth sub-test pad TP3b and the eighth sub-test pad TP4b to measure an output signal generated in response to the test signal. In an example, a current Ita may be provided to the second crack detection line RL2 as the test signal, a voltage Vta may be measured as the output signal, and the current Ita (i.e. the test signal) and the voltage Vta (i.e. the output signal) may be compared to obtain a resistance value.

After the display device is bent, the current Ita may be provided to the second crack detection line RL2 as the test signal, and the voltage Vta may be measured as the output signal to obtain a resistance value. Then, whether the second crack detection line RL2 has cracked may be detected by comparing the resistance value before the bending of the display device and the resistance value after the bending of the display device.

According to the current embodiment, the output signal of the first crack detection line RL1 and the output signal of the second crack detection line RL2 can be independently measured. Accordingly, when a crack is detected in the first crack detection line RL1, it can be judged that elements located on the bending area BA, in particular, the first bridge wiring BL1 and the third bridge wiring BL3 located at the same level as the first crack detection line RL1 have cracked.

That is, according to the current embodiment, it is possible to judge whether a wiring located at which level has cracked among the wirings located on the bending area BA.

Figure 23:
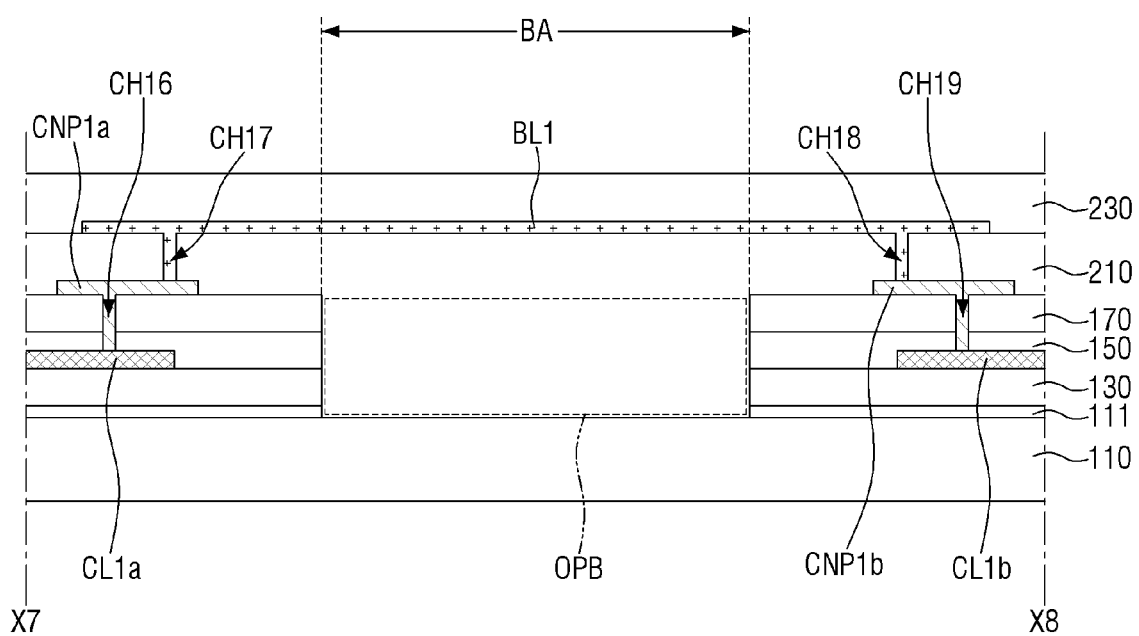
FIG. 23 is a cross-sectional view of a display device according to an embodiment, taken along a line corresponding to the line X7-X8 of FIG. 10.
Figure 24:
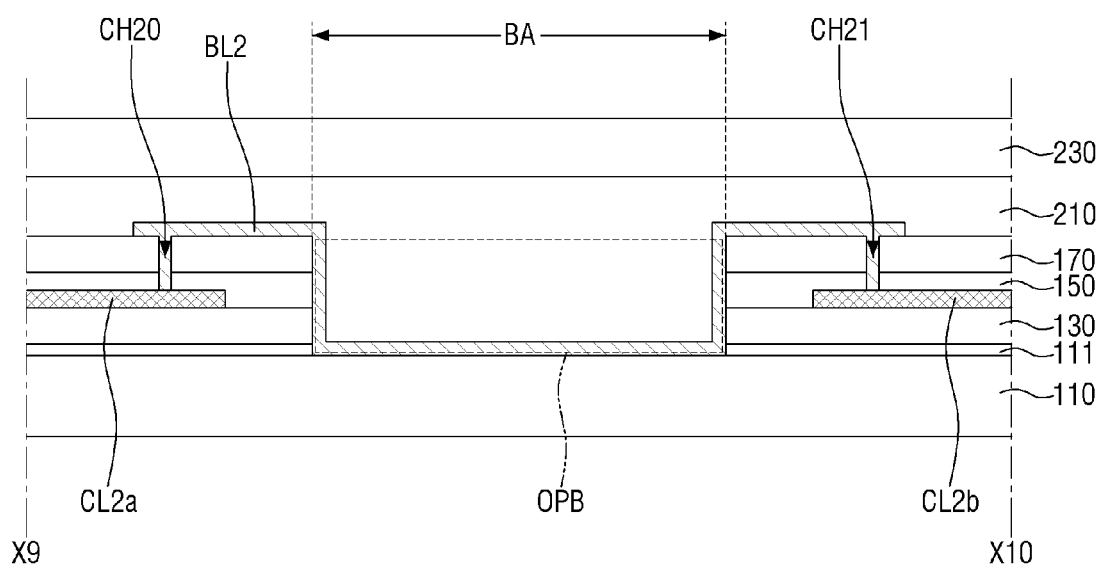
FIG. 24 is a cross-sectional view of the display device of FIG. 23, taken along a line corresponding to the line X9-X10 of FIG. 10.
Figure 25:
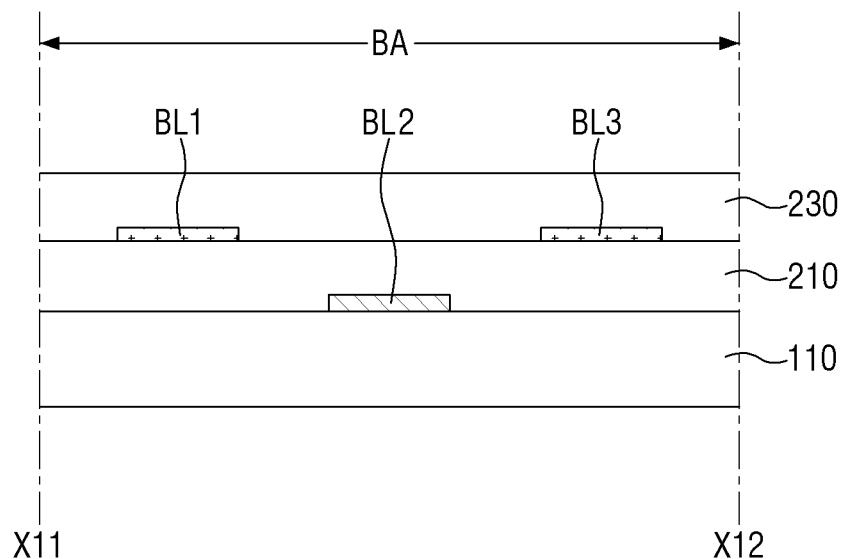
FIG. 25 is a cross-sectional view of the display device of FIG. 23, taken along a line corresponding to the line X11-X12 of FIG. 10.

FIG. 23 is a cross-sectional view of a display device according to an embodiment, taken along a line corresponding to the line X7-X8 of FIG. 10. FIG. 24 is a cross-sectional view of the display device of FIG. 23, taken along a line corresponding to the line X9-X10 of FIG. 10. FIG. 25 is a cross-sectional view of the display device according to FIG. 23, taken along a line corresponding to the line X11-X12 of FIG. 10. The display device according to the current embodiment is substantially the same as the embodiment shown in FIGS. 11 through 13, except that a stress relieving layer 220 is not provided, and an opening OPB is filled with a first upper insulating layer 210. Therefore, differences from the structure of FIGS. 11 through 13 will be mainly described below.

Referring to FIGS. 10 and 23 through 25, the opening OPB formed in inorganic insulating layers 111, 130, 150, and 170 to correspond to a bending area BA is filled with the first upper insulating layer 210.

A portion of a second bridge wiring BL2 which does not overlap the bending area BA is located on the second lower insulating layer 170. The second bridge wiring BL2 is connected to a side of a third connection wiring CL2a through a twentieth contact hole CH20 passing through the first lower insulating layer 150 and the second lower insulating layer 170 and is connected to a fourth connection wiring CL2b through a twenty-first contact hole CH21 passing through the first lower insulating layer 150 and the second lower insulating layer 170.

A portion of the second bridge wiring BL2 which overlaps the bending area BA is located on a base substrate 110. The second bridge wiring BL2 may contact sides of the inorganic insulating layers 111, 130, 150, and 170 around the opening OPB.

Other elements may be the same as those described above, and thus a description of these elements will be omitted.

Figure 26:
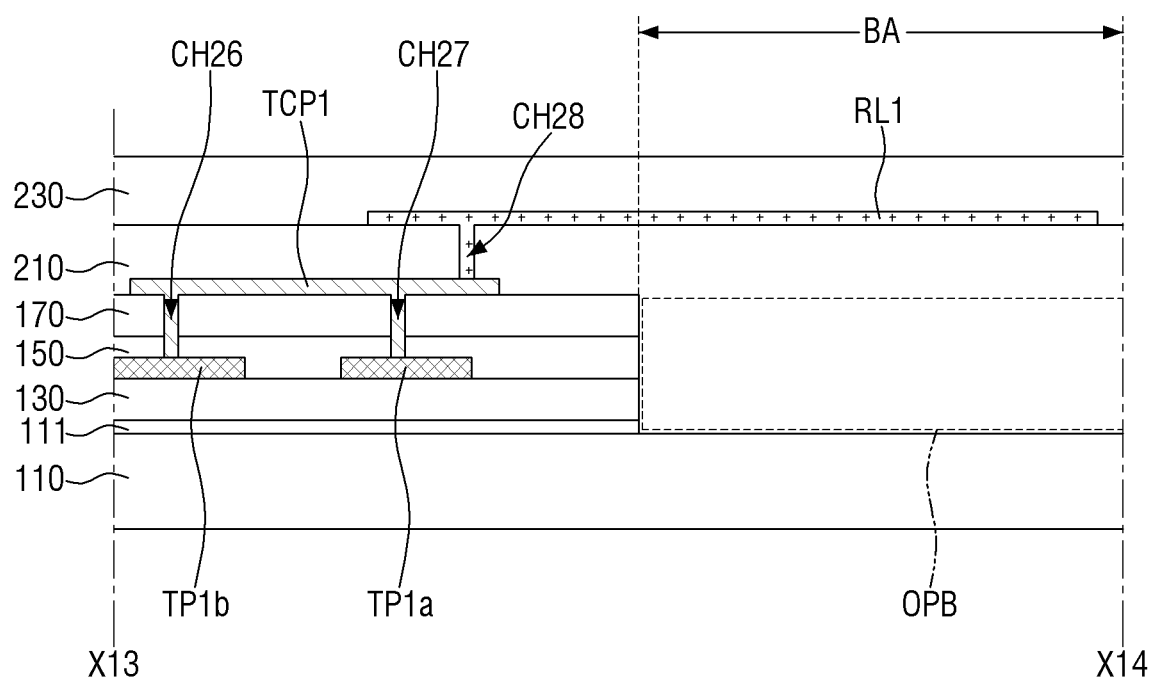
FIG. 26 is a cross-sectional view of a display device according to an embodiment, taken along a line corresponding to the line X13-X14 of FIG. 14.

FIG. 26 is a cross-sectional view of a display device according to an embodiment, taken along a line corresponding to the line X13-X14 of FIG. 14. The current embodiment is different from the embodiment shown in FIGS. 15 and 16 in that a stress relieving layer 220 is not provided, and an opening OPB is filled with a first upper insulating layer 210. Since other elements may be substantially the same as those described above with reference to FIGS. 14 through 16, a description of these elements will be omitted.

Figure 27:
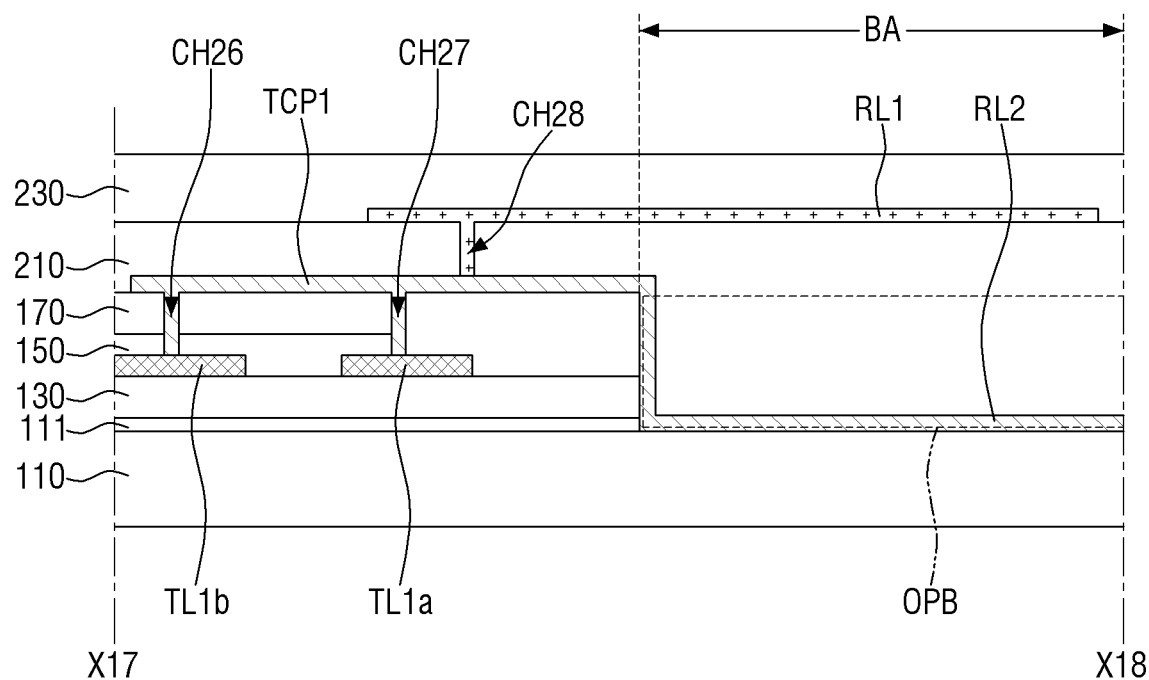
FIG. 27 is a cross-sectional view of a display device according to an embodiment, taken along a line corresponding to the line X17-X18 of FIG. 18.

FIG. 27 is a cross-sectional view of a display device according to an embodiment, taken along a line corresponding to the line X17-X18 of FIG. 18. The current embodiment is different from the embodiment shown in FIG. 19 in that a stress relieving layer 220 is not provided, an opening OPB is filled with a first upper insulating layer 210, and a portion of a second crack detection line RL2 which overlaps a bending area BA is located on a base substrate 110. Since other elements may be substantially the same as those described above with reference to FIGS. 18 and 19, a description of these elements will be omitted.

Figure 28:
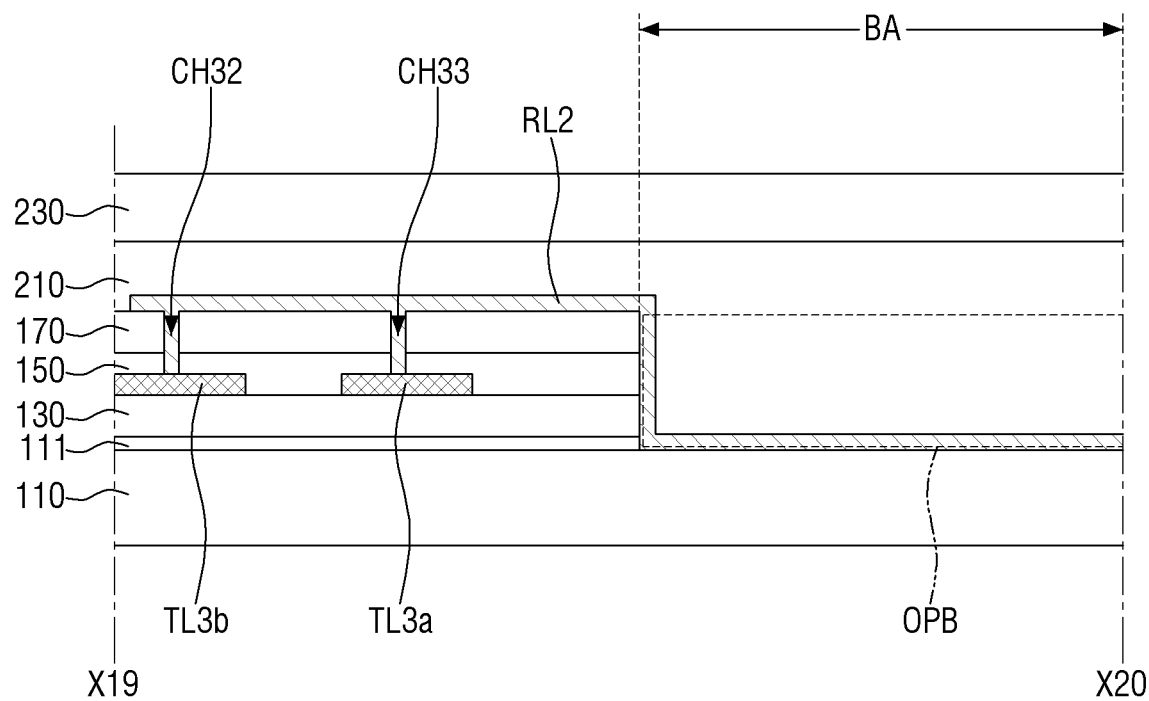
FIG. 28 is a cross-sectional view of a display device according to an embodiment, taken along a line corresponding to the line X19-X20 of FIG. 20.

FIG. 28 is a cross-sectional view of a display device according to an embodiment, taken along a line corresponding to the line X19-X20 of FIG. 20. The current embodiment is different from the embodiment shown in FIG. 21 in that a stress relieving layer 220 is not provided, an opening OPB is filled with a first upper insulating layer 210, and a portion of a second crack detecting line RL2 which overlaps a bending area BA is located on a base substrate 110. Since other elements may be substantially the same as those described above with reference to FIGS. 20 and 21, a description of these elements will be omitted.

According to embodiments, it is possible to provide a display device in which at least a portion of a non-display area is bent.

In addition, according to embodiments, it is possible to provide a display device capable of detecting a crack generated in a bent portion.

However, the effects of the present inventive concept are not restricted to those set forth herein. The above and other effects of the present inventive concept will become more apparent to one of ordinary skill in the art to which the present inventive concept pertains by referencing the claims.

Although some exemplary embodiments have been disclosed for illustrative purposes, these embodiments are only presented as examples and do not limit the present inventive concept. Those skilled in the art will appreciate that various modifications and applications are possible, without departing from the scope and spirit of embodiments as disclosed in the accompanying claims. For example, each element specified in embodiments can be variously modified and implemented. Further, differences related to such modifications and applications should be interpreted as being included in the scope of the embodiments as defined by the accompanying claims.

What is claimed is:

1. A display device comprising:
   a base substrate comprising a display area and a peripheral area other than the display area, wherein the peripheral area comprises a bending area;
   a first test signal line and a second test signal line which are located on the peripheral area of the base substrate and at least partially spaced apart from each other;
   a lower insulating layer located on the first test signal line and the second test signal line;
   a first test connection pattern which is located on the lower insulating layer and electrically connected to the first test signal line;
   a second test connection pattern which is located on the lower insulating layer, spaced apart from the first test connection pattern, and electrically connected to the second test signal line;
   an upper insulating layer located on the first test connection pattern and the second test connection pattern;
   a first crack detection line which is located on the upper insulating layer, is electrically connected to the first test connection pattern and the second test connection pattern, and includes at least a portion overlapping the bending area of the base substrate;
   a first test pad which is located on the peripheral area of the base substrate and connected to the first test signal line; and
   a second test pad which is spaced apart from the first test pad and connected to the second test signal line,
   wherein the first test pad comprises a first sub-test pad and a second sub-test pad, the second test pad comprises a third sub-test pad and a fourth sub-test pad,
   wherein the first sub-test pad, the second sub-test pad, the third sub-test pad, and the fourth sub-test pad are spaced apart from each other, and
   wherein a test signal for crack detection is transmitted to the first sub-test pad and the third sub-test pad, and an output signal generated in response to the test signal is output to the second sub-test pad and the fourth sub-test pad.

2. The display device of claim 1, wherein the first test signal line and the second test signal line are made of a first conductive material, the first test connection pattern and the second test connection pattern are made of a second conductive material, and the first crack detection line is made of a third conductive material.

3. The display device of claim 1, wherein the first test signal line and the second test signal line do not overlap the bending area of the base substrate.

4. The display device of claim 1, wherein the first test signal line comprises a first sub-test signal line which is connected to the first test connection pattern and the first sub-test pad and a second sub-test signal line which is connected to the first test connection pattern and the second sub-test pad, and the second test signal line comprises a third sub-test signal line which is connected to the second test connection pattern and the third sub-test pad and a fourth sub-test signal line which is connected to the second test connection pattern and the fourth sub-test pad.

5. The display device of claim 1, further comprising a stress relieving layer which is located on the bending area of the base substrate and overlaps the first crack detection line, wherein the lower insulating layer comprises an opening which is formed on the bending area of the base substrate and overlaps the first crack detection line, the stress relieving layer is located in the opening, and the upper insulating layer is located on the stress relieving layer.

6. The display device of claim 5, wherein the lower insulating layer comprises an inorganic material, and the stress relieving layer comprises an organic material.

7. The display device of claim 1, wherein the lower insulating layer comprises an opening which is formed on the bending area of the base substrate and overlaps the first crack detection line, and the upper insulating layer is further located in the opening.

8. The display device of claim 7, wherein the lower insulating layer comprises an inorganic material, and the upper insulating layer comprises an organic material.

9. The display device of claim 1, further comprising:
   a scan line located on the display area of the base substrate; and
   a data line and a driving voltage line which are located on the display area of the base substrate, are insulated from the scan line, and intersect the scan line,
   wherein the scan line is located between the base substrate and the lower insulating layer, the data line is located between the lower insulating layer and the upper insulating layer, and the driving voltage line is located on the upper insulating layer.

10. The display device of claim 9, wherein the scan line, the first test signal line, and the second test signal line are made of a first conductive material, the data line, the first test connection pattern, and the second test connection pattern are made of a second conductive material, and the driving voltage line and the first crack detection line are made of a third conductive material.

11. The display device of claim 10, further comprising an additional driving voltage line which is located between the lower insulating layer and the upper insulating layer and overlaps the driving voltage line, wherein the additional driving voltage line is made of the second conductive material.

12. The display device of claim 1, further comprising:
a switching element which is located on the display area of the base substrate and comprises a semiconductor layer and a gate electrode overlapping the semiconductor layer;
a connection electrode connected to the semiconductor layer of the switching element;
a bridge pattern connected to the connection electrode;
an insulating layer located on the bridge pattern; and
a light emitting element which is located on the insulating layer and connected to the bridge pattern,
wherein the lower insulating layer is located between the switching element and the connection electrode, and the upper insulating layer is located between the connection electrode and the bridge pattern.

13. The display device of claim 12, wherein the gate electrode, the first test signal line, and the second test signal line are made of a first conductive material, the connection electrode, the first test connection pattern, and the second test connection pattern are made of a second conductive material, and the bridge pattern and the first crack detection line are made of a third conductive material.

14. A display device comprising:
a base substrate comprising a display area and a peripheral area other than the display area, wherein the peripheral area comprises a bending area;
a first test signal line and a second test signal line which are located on the peripheral area of the base substrate and at least partially spaced apart from each other;
a lower insulating layer located on the first test signal line and the second test signal line;
a first test connection pattern which is located on the lower insulating layer and electrically connected to the first test signal line;
a second test connection pattern which is located on the lower insulating layer, spaced apart from the first test connection pattern, and electrically connected to the second test signal line;
an upper insulating layer located on the first test connection pattern and the second test connection pattern;
a first crack detection line which is located on the upper insulating layer, is electrically connected to the first test connection pattern and the second test connection pattern, and includes at least a portion overlapping the bending area of the base substrate;
a third test signal line located on the peripheral area of the base substrate;
a fourth test signal line at least partially spaced apart from the third test signal line; and
a second crack detection line which is located on the lower insulating layer, is connected to the third test signal line and the fourth test signal line, and includes at least a portion overlapping the bending area of the base substrate,
wherein the third test signal line and the fourth test signal line are spaced apart from the first test signal line and the second test signal line, and the upper insulating layer is located on the second crack detection line.

15. The display device of claim 14, wherein the first test signal line, the second test signal line, the third test signal line, and the fourth test signal line are made of a first conductive material, the first test connection pattern, the second test connection pattern, and the second crack detection line are made of a second conductive material, and the first crack detection line is made of a third conductive material.

16. The display device of claim 14, wherein the first test signal line comprises a first sub-test signal line and a second sub-test signal line which are connected to the first test connection pattern, the second test signal line comprises a third sub-test signal line and a fourth sub-test signal line which are connected to the second test connection pattern, the third test signal line comprises a fifth sub-test signal line and a sixth sub-test signal line which are connected to the second crack detection line, and the fourth test signal line comprises a seventh sub-test signal line and an eighth sub-test signal line which are connected to the second crack detection line.

17. A display device comprising:
a base substrate comprising a display area and a peripheral area other than the display area, wherein the peripheral area comprises a bending area;
a first test signal line and a second test signal line which are located on the peripheral area of the base substrate and at least partially spaced apart from each other;
a lower insulating layer located on the first test signal line and the second test signal line;
a first test connection pattern which is located on the lower insulating layer and electrically connected to the first test signal line;
a second test connection pattern which is located on the lower insulating layer, spaced apart from the first test connection pattern, and electrically connected to the second test signal line;
an upper insulating layer located on the first test connection pattern and the second test connection pattern;
a first crack detection line which is located on the upper insulating layer, is electrically connected to the first test connection pattern and the second test connection pattern, and includes at least a portion overlapping the bending area of the base substrate;
a first data line located on the display area of the base substrate;
a first connection pad located on the peripheral area of the base substrate; and
a first connection wiring part connecting the first data line and the first connection pad,
wherein the first connection wiring part comprises:
a first connection wiring which is located on the peripheral area of the base substrate and connected to the first data line;
a second connection wiring which is located on the peripheral area of the base substrate, spaced apart from the first connection wiring by the bending area arranged between the first connection wiring and the second connection wiring, and connected to the first connection pad;
a first connection pattern which is located on the lower insulating layer and connected to the first connection wiring;
a second connection pattern which is located on the lower insulating layer, connected to the second connection wiring, and spaced apart from the first connection pattern; and
a first bridge wiring which is located on the upper insulating layer, is connected to the first connection pattern and the second connection pattern, and overlaps the bending area of the base substrate, wherein the first connection wiring and the second connection wiring are located between the lower insulating layer and the base substrate.

18. The display device of claim 17, wherein the first test signal line, the second test signal line, the first connection pattern, and the second connection pattern are made of a first conductive material, the first data line, the first test connection pattern, the second test connection pattern, the first connection pattern, and the second connection pattern are made of a second conductive material, and the first crack detection line and the first bridge wiring are made of a third conductive material.

19. The display device of claim 17, further comprising a stress relieving layer which is located on the bending area of the base substrate and overlaps the first bridge wiring, wherein the lower insulating layer comprises an opening which is formed on the bending area of the base substrate and overlaps the first bridge wiring, the stress relieving layer is located in the opening, and the upper insulating layer is located on the stress relieving layer.

20. The display device of claim 19, wherein the lower insulating layer comprises an inorganic material, and the stress relieving layer comprises an organic material.

21. The display device of claim 17, wherein the lower insulating layer comprises an opening which is formed on the bending area of the base substrate and overlaps the first bridge wiring, and the upper insulating layer is further located in the opening.

22. The display device of claim 21, wherein the lower insulating layer comprises an inorganic material, and the upper insulating layer comprises an organic material.

23. The display device of claim 17, further comprising:
a second data line which is located on the display area of the base substrate and located adjacent to the first data line;
a second connection pad located on the peripheral area of the base substrate; and
a second connection wiring part connecting the second data line and the second connection pad,
wherein the second connection wiring part comprises:
a third connection wiring which is located on the peripheral area of the base substrate and connected to the second data line;
a fourth connection wiring which is located on the peripheral area of the base substrate, spaced apart from the third connection wiring by the bending area arranged between the third connection wiring and the fourth connection wiring, and connected to the second connection pad; and
a second bridge wiring which is located on the lower insulating layer, is connected to the third connection wiring and the fourth connection wiring, and overlaps the bending area,
wherein the third connection wiring and the fourth connection wiring are located between the lower insulating layer and the base substrate, and the upper insulating layer is located on the second bridge wiring.

24. A display device comprising:
a base substrate comprising a display area and a peripheral area other than the display area, wherein the peripheral area comprises a bending area;
a first test signal line and a second test signal line which are located on the peripheral area of the base substrate and at least partially spaced apart from each other;
a crack detection line which includes at least a portion located on the bending area of the base substrate and is electrically connected to the first test signal line and the second test signal line; and
a data line and a driving voltage line which are located on the display area of the base substrate,
wherein the data line and the driving voltage line are located on different layers, the data line and the crack detection line are located on different layers, and the crack detection line is located on a different layer from the first test signal line and the second test signal line, and
wherein the crack detection line and the driving voltage line are located on a same layer and made of a same material.

25. The display device of claim 24, further comprising:
a first test connection pattern which is located on the first test signal line and connected to the first test signal line and the crack detection line; and
a second test connection pattern which is located on the second test signal line, spaced apart from the first test connection pattern, and connected to the second test signal line and the crack detection line,
wherein the data line, the first test connection pattern, and the second test connection pattern are located on a same layer and made of a same material.

26. A display device comprising:
a base substrate comprising a display area and a peripheral area other than the display area, wherein the peripheral area comprises a bending area;
a first test signal line and a second test signal line which are located on the peripheral area of the base substrate and at least partially spaced apart from each other;
a crack detection line which includes at least a portion located on the bending area of the base substrate and is electrically connected to the first test signal line and the second test signal line;
a data line located on the display area of the base substrate;
a connection pad located on the peripheral area of the base substrate;
a bridge wiring electrically connecting the data line and the connection pad;
a first connection wiring connecting the data line and the bridge wiring; and
a second connection wiring connecting the connection pad and the bridge wiring,
wherein the data line and the bridge wiring are located on different layers, the crack detection line and the bridge wiring are located on a same layer, and the crack detection line is located on a different layer from the first test signal line and the second test signal line, and
wherein the first connection wiring, the second connection wiring, the first test signal line, and the second test signal line are located on a same layer and made of a same material.

27. The display device of claim 26, wherein the crack detection line and the bridge wiring are made of a same material and located directly on the same layer.

28. The display device of claim 26, further comprising:
a first test connection pattern which is located on the first test signal line and connected to the first test signal line and the crack detection line; and
a second test connection pattern which is located on the second test signal line, spaced apart from the first test connection pattern, and connected to the second test signal line and the crack detection line, wherein the data line, the first test connection pattern, and the second test connection pattern are located on a same layer and made of a same material.

29. The display device of claim 26, further comprising:
a first connection pattern which is located on the first connection wiring and connected to the first connection wiring and the bridge wiring; and
a second connection pattern which is located on the second connection wiring, spaced apart from the first connection pattern, and connected to the second connection wiring and the bridge wiring,
wherein the first test connection pattern, the second test connection pattern, the first connection pattern, and the second connection pattern are located on a same layer and made of a same material.

* * * * *